(12) United States Patent
Katayama

(10) Patent No.: US 10,892,000 B2
(45) Date of Patent: Jan. 12, 2021

(54) SEMICONDUCTOR MEMORY DEVICE

(71) Applicant: TOSHIBA MEMORY CORPORATION, Tokyo (JP)

(72) Inventor: Akira Katayama, Yokohama Kanagawa (JP)

(73) Assignee: TOSHIBA MEMORY CORPORATION, Tokyo (JP)

(*) Notice: Subject to any disclaimer, the term of this patent is extended or adjusted under 35 U.S.C. 154(b) by 0 days.

(21) Appl. No.: 16/559,689

(22) Filed: Sep. 4, 2019

(65) Prior Publication Data

US 2020/0273513 A1    Aug. 27, 2020

(30) Foreign Application Priority Data

Feb. 25, 2019   (JP) .................................. 2019-031820

(51) Int. Cl.
*G11C 11/00* (2006.01)
*G11C 11/16* (2006.01)
*H01L 27/22* (2006.01)

(52) U.S. Cl.
CPC ...... *G11C 11/1675* (2013.01); *G11C 11/1659* (2013.01); *G11C 11/161* (2013.01); *G11C 11/1673* (2013.01); *H01L 27/224* (2013.01)

(58) Field of Classification Search
CPC ............ G11C 11/1675; G11C 11/1659; G11C 11/161; G11C 11/1673
See application file for complete search history.

(56) References Cited

U.S. PATENT DOCUMENTS

| 5,677,875 | A  | * | 10/1997 | Yamagata | ............... | G11C 16/08 |
| | | | | | | 365/185.11 |
| 7,876,619 | B2 | * | 1/2011 | Takeda | .................... | G11C 16/10 |
| | | | | | | 365/185.14 |
| 8,873,294 | B2 | * | 10/2014 | Shim | ...................... | G11C 16/14 |
| | | | | | | 365/185.05 |
| 2018/0277186 | A1 | | 9/2018 | Hatsuda et al. | | |

FOREIGN PATENT DOCUMENTS

JP           2018163713  A       10/2018

* cited by examiner

*Primary Examiner* — Pho M Luu
(74) *Attorney, Agent, or Firm* — Holtz, Holtz & Volek PC

(57) ABSTRACT

A semiconductor memory device includes a control circuit configured to charge a first node to a first voltage based on a resistance of a memory cell when first data is stored, write second data after the first node is charged to the first voltage, charge a second node to a second voltage based on a resistance of the memory cell when second data is stored, and determine, based on the first and second voltages, whether the first data is different from the second data. The circuit includes a first element including a first end coupled to the first node, and a second end coupled to a third node between the first and second nodes, a second element including first and second ends coupled to the first node, and a third element including a first end coupled to the second node and a second end coupled to the third node.

17 Claims, 18 Drawing Sheets

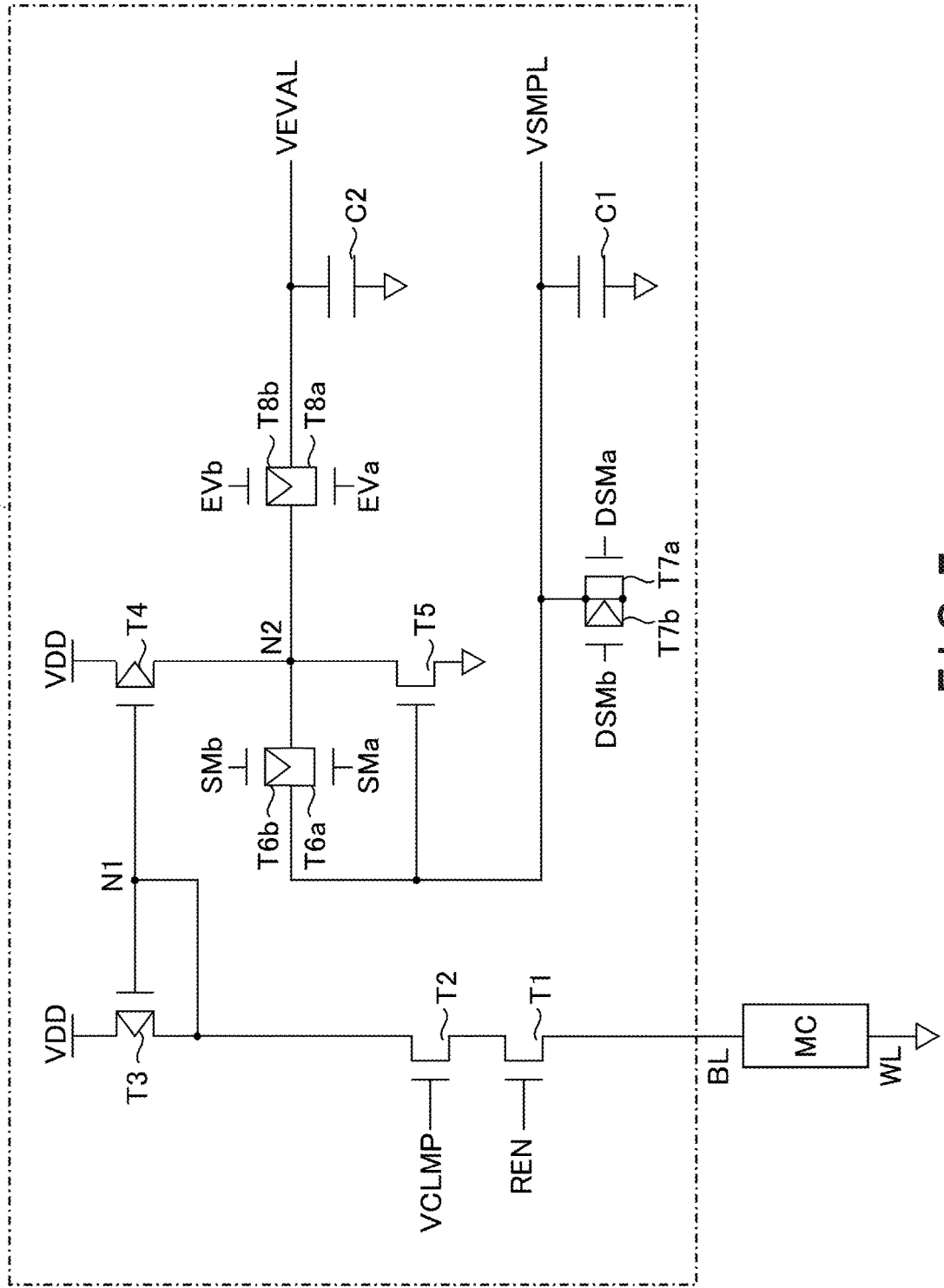
F I G. 7

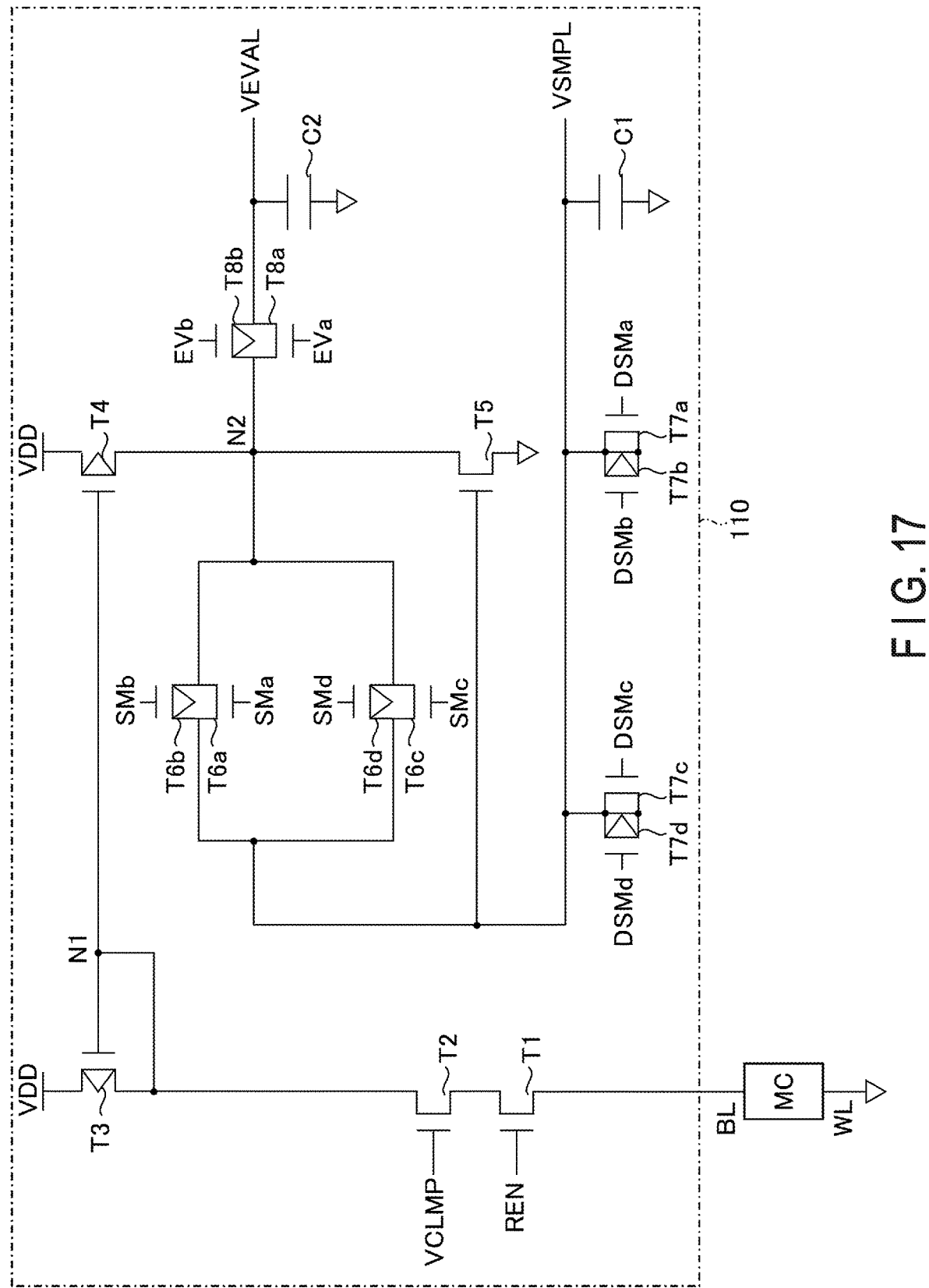
F I G. 17

SEMICONDUCTOR MEMORY DEVICE

CROSS-REFERENCE TO RELATED APPLICATIONS

This application is based upon and claims the benefit of priority from Japanese Patent Application No. 2019-031820, filed Feb. 25, 2019, the entire contents of which are incorporated herein by reference.

FIELD

Embodiments described herein relate generally to a semiconductor memory device.

BACKGROUND

A semiconductor memory device using resistance change elements as memory elements is known. For example, a magnetoresistive random access memory (MRAM) using magnetoresistive effect elements as resistance change elements is known.

BRIEF DESCRIPTION OF THE DRAWINGS

FIG. 7 is a circuit diagram to explain a configuration of a pre-amplifier of the semiconductor memory device according to the first embodiment.

FIG. 17 is a circuit diagram to explain a configuration of a pre-amplifier of the semiconductor memory device according to the fourth embodiment.

DETAILED DESCRIPTION

In general, according to one embodiment, a semiconductor memory device includes a memory cell and a control circuit. The control circuit configured to charge a first node to a first voltage being based on an electric resistance of the memory cell when first data is stored in the memory cell; write second data to the memory cell after the first node is charged to the first voltage; charge a second node to a second voltage being based on an electric resistance of the memory cell when the second data is stored in the memory cell; and determine, based on the first voltage and the second voltage, whether or not the first data is different from the second data. The control circuit further includes: a first switching element including a first end electrically coupled to the first node, and a second end electrically coupled to a third node between the first node and the second node; a second switching element including a first end and a second end that are electrically coupled to the first node; and a third switching element including a first end electrically coupled to the second node and a second end electrically coupled to the third node.

Hereinafter, embodiments will be described with reference to the drawings. In the explanation that follows, structural elements having similar functions and configurations will be denoted by the same reference symbols. If it is necessary to distinguish the structural elements having the same reference symbols from each other, an additional symbol is added after the reference symbol. If it is unnecessary to distinguish the structural elements, only a common reference symbol is assigned to the structural elements, and no additional symbol is added. Herein, additional symbols are not limited to subscripts or superscripts, and they may be indices meaning arrangements, added to ends of reference symbols.

1. First Embodiment

A semiconductor memory device according to a first embodiment will be described. The semiconductor memory device according to the first embodiment is, for example, a magnetoresistive random access memory in which an element having a magnetoresistive effect provided by a magnetic tunnel junction (MTJ) (such an element may be called an MTJ element or a magnetoresistive effect element) is used as a resistance change element.

1.1 Configuration First, a configuration of the semiconductor memory device according to the first embodiment will be described.

1.1.1 Configuration of Semiconductor Memory Device

Figure 1:
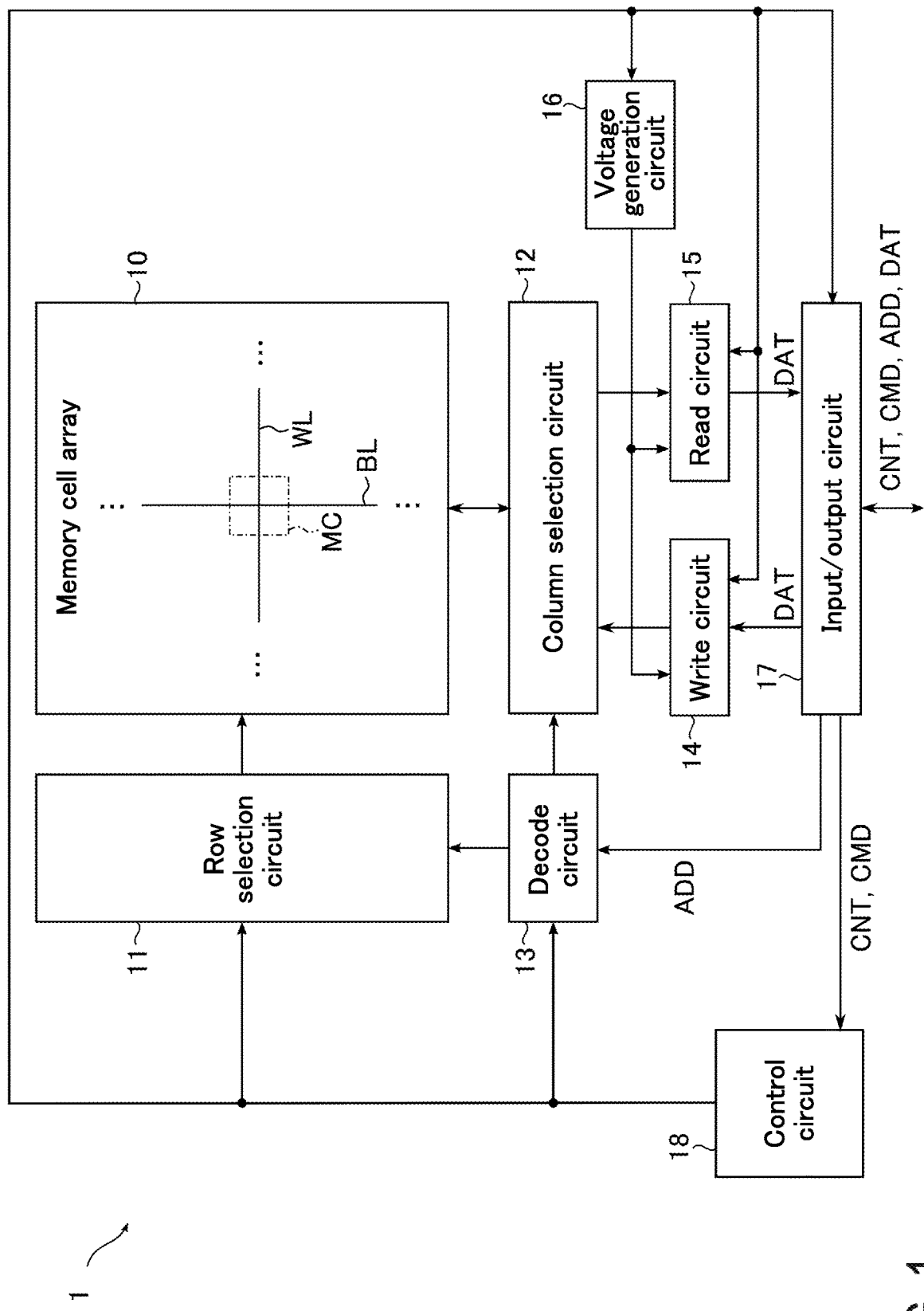
FIG. 1 is a block diagram to explain a configuration of a semiconductor memory device according to a first embodiment.

FIG. 1 is a block diagram illustrating a configuration of the semiconductor memory device according to the first embodiment. As illustrated in FIG. 1, the semiconductor memory device 1 includes a memory cell array 10, a row selection circuit 11, a column selection circuit 12, a decode circuit 13, a write circuit 14, a read circuit 15, a voltage generation circuit 16, an input/output circuit 17, and a control circuit 18.

The memory cell array 10 includes a plurality of memory cells MC, each associated with a pair of a row and a column. Specifically, memory cells MC arranged in the same row are coupled to the same word line WL, and memory cells MC arranged in the same column are coupled to the same bit line BL.

The row selection circuit 11 is coupled to the memory cell array 10 via word lines WL. To the row selection circuit 11, a decoding result of an address ADD provided from the decode circuit 13 (row address) is supplied. The row selection circuit 11 sets a word line WL corresponding to a row which is selected based on the decoding result of an address ADD to a selected state. Hereinafter, the word line WL that has been set to a selected state will be referred to as a selected word line WL. The word lines WL other than the selected word line WL will be referred to as non-selected word lines WL.

The column selection circuit 12 is coupled to the memory cell array 10 via bit lines BL. To the column selection circuit 12, a decoding result of an address ADD provided from the decode circuit 13 (column address) is supplied. The column selection circuit 12 sets a bit line corresponding to a column which is selected based on the decoding result of an address ADD to a selected state. Hereinafter, the bit line BL that has been set to a selected state will be referred to as a selected bit line BL. The bit lines BL other than the selected bit line BL will be referred to as non-selected bit lines BL.

The decode circuit 13 decodes an address ADD from the input/output circuit 17. The decode circuit 13 supplies the decoding result of the address ADD to the row selection circuit 11 and the column selection circuit 12. The address ADD includes an address of a column to be selected and an address of a row to be selected.

The write circuit 14 writes data to a memory cell MC. The write circuit 14 includes, for example, a write driver (not illustrated).

The read circuit 15 reads data from a memory cell MC. The read circuit 15 includes, for example, a pre-amplifier and a sense amplifier (not illustrated). The configurations of the pre-amplifier and the sense amplifier will be described later in detail.

The voltage generation circuit 16 generates voltages for various operations of the memory cell array 10 by using a power supply voltage provided from an outside (not illustrated) of the semiconductor memory device 1. For example, the voltage generation circuit 16 generates various voltages required for a write operation, and outputs the voltage to the write circuit 14. Furthermore, for example, the voltage generation circuit 16 generates various voltages required for a read operation, and outputs the voltage to the read circuit 15.

The input/output circuit 17 transfers an address ADD provided from the outside of the semiconductor memory device 1 to the decode circuit 13. The input/output circuit 17 transfers a command CMD provided from the outside of the semiconductor memory device 1 to the control circuit 18. The input/output circuit 17 transmits and receives various control signals CNT between the outside of the semiconductor memory device 1 and the control circuit 18. The input/output circuit 17 transfers data DAT provided from the outside of the semiconductor memory device 1 to the write circuit 14, and outputs data DAT transferred from the read circuit 15 to the outside of the semiconductor memory device 1.

The control circuit 18 controls the operations of the row selection circuit 11, the column selection circuit 12, the decode circuit 13, the write circuit 14, the read circuit 15, the voltage generation circuit 16, and the input/output circuit 17 in the semiconductor memory device 1 based on a control signal CNT and a command CMD.

1.1.2 Configuration of Memory Cell Array

Figure 2:
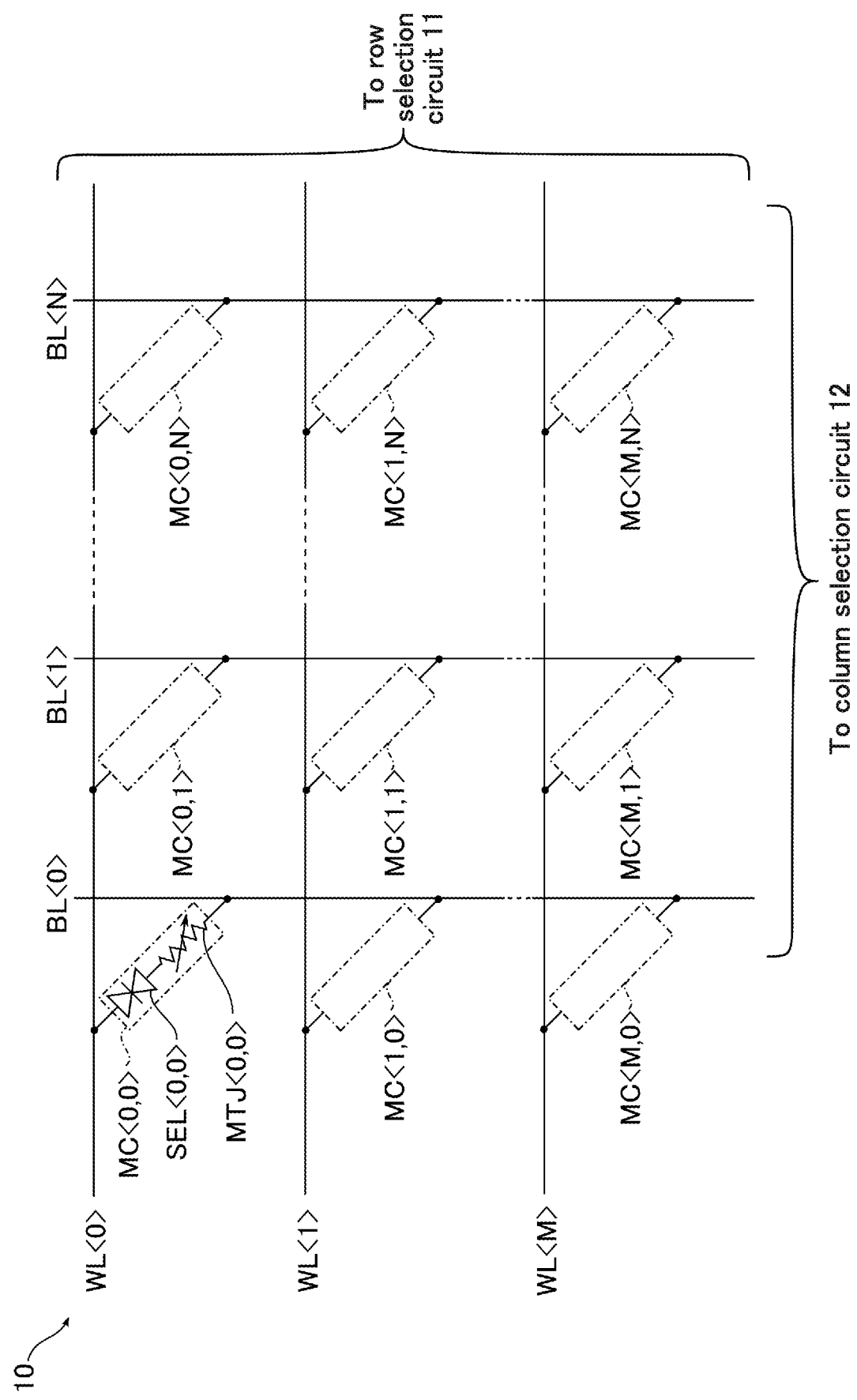
FIG. 2 is a circuit diagram to explain a configuration of a memory cell array of the semiconductor memory device according to the first embodiment.

Next, a configuration of the memory cell of the semiconductor memory device according to the first embodiment will be described with reference to FIG. 2. FIG. 2 is a circuit diagram illustrating a configuration of the memory cell array of the semiconductor memory device according to the first embodiment. In FIG. 2, the word lines WL, the bit lines BL, and the memory cells MC are classified by additional symbols including indices ("< >").

As shown in FIG. 2, the memory cells MC are arranged in a matrix in the memory cell array 10, and are respectively associated with a pair of one of the bit lines BL (BL<0>, BL<1>, . . . , BL<N>) and one of the word lines WLd (WL<0>, WL<1>, . . . , WL<M>) (M and N are integers). In other words, a memory cell MC<i,j> ($0 \leq i \leq M$, $0 \leq j \leq N$) is coupled between a word line WL<i> and a bit line BL<j>. A memory cell MC<i,j> includes a switching element SEL<i,j> and a magnetoresistive effect element MTJ<i,j> coupled in series thereto.

The switching element SEL has a function as a selector that controls a supply of a current to a corresponding magnetoresistive effect element MTJ when data is read from and written to the magnetoresistive effect element MTJ. Specifically, the switching element SEL in a memory cell MC, for example, serves as an insulator having a large resistance value and cuts off a current (in other words, is in OFF state) when a voltage applied to the memory cell MC is below a threshold voltage Vth, and serves as a conductor having a small resistance value and allows a current to flow (in other words, is in ON state) when the voltage exceeds the threshold voltage Vth. In other words, the switching element SEL has a function of switching between ON state and OFF state in accordance with the voltage applied to the memory cell MC, irrespective of a direction of a flowing current.

The switching element SEL may be an element between two terminals, for example. When a voltage applied between two terminals is smaller than the threshold voltage Vth, a corresponding switching element is in a "high-resistance" state, such as an electrically non-conductive state. When a voltage applied between two terminals is equal to or larger than the threshold voltage Vth, a corresponding switching element is changed into a "low-resistance" state, such as an electrically conductive state. The switching element may have this function regardless of the polarity of voltage. For example, the switching element may include at least one type of chalcogen element selected from a group of tellurium (Te), selenium (Se), and sulfur (S). Alternatively, the switching element may include chalcogenide, which is a compound containing the aforementioned chalcogen element. This switching element may include at least one element selected from a group consisting of boron (B), aluminum (Al), gallium (Ga), indium (In), carbon (C), silicon (Si), germanium (Ge), tin (Sn), arsenic (As), phosphorus (P), antimony (Sb), titanium (Ti), and bismuth (Bi). Specifically, the switching element may include at least two elements selected from germanium (Ge), antimony (Sb), tellurium (Te), titanium (Ti), arsenic (As), indium (In), and bismuth (Bi). Furthermore, this switching element may include an oxide of at least one element selected from Ti, vanadium (V), chromium (Cr), niobium (Nb), molybdenum (Mo), hafnium (Hf), and tungsten (W).

A resistance value of a magnetoresistive effect element MTJ can be switched between a low-resistance state and a high-resistance state by a current whose supply is controlled by the switching element SEL. The magnetoresistive effect element MTJ functions as a memory device being capable of writing data in accordance with the change of its resistance state, storing written data in a non-volatile manner, and reading the stored data out.

Figure 3:
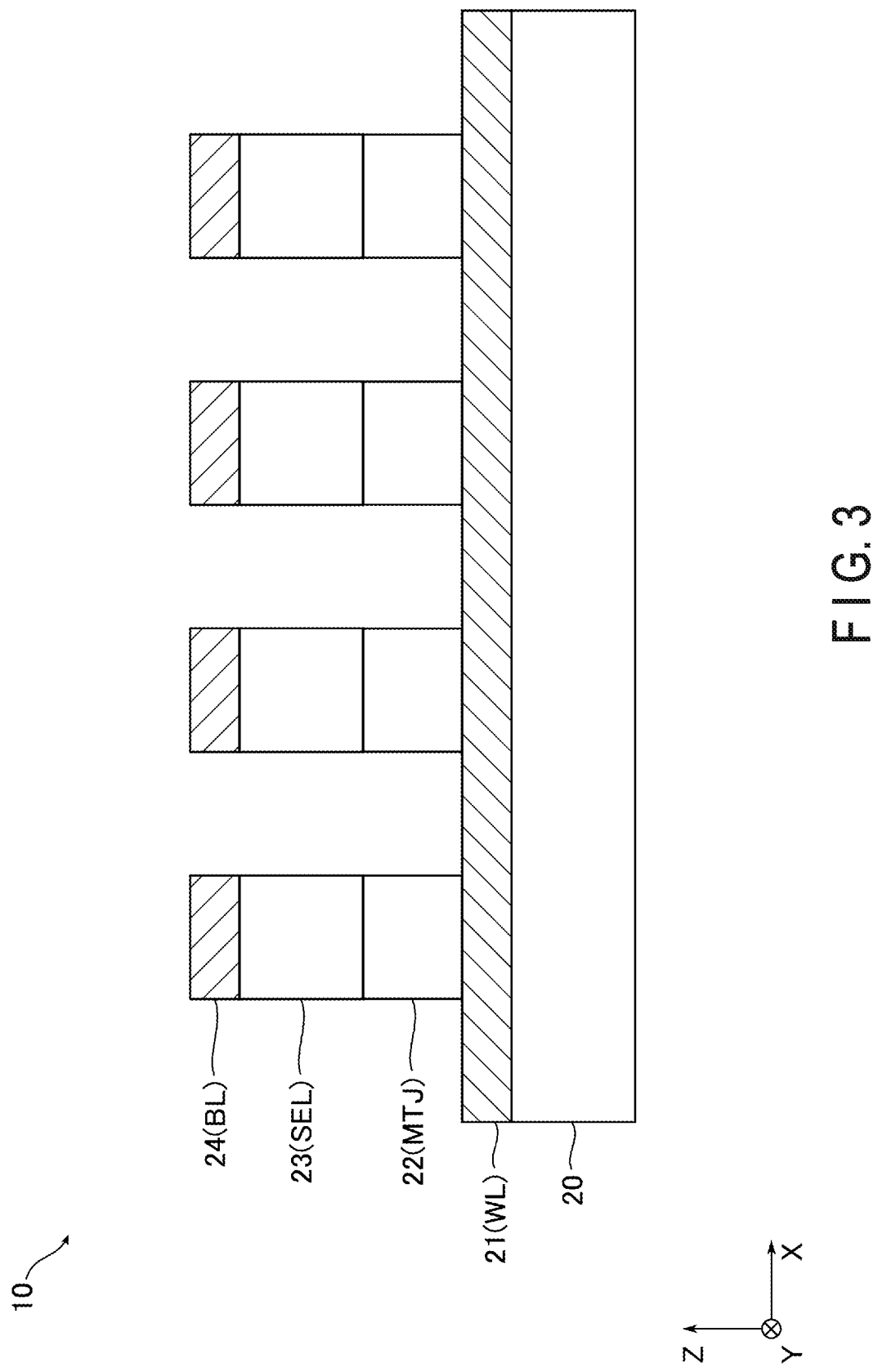
FIG. 3 is a sectional view to explain a configuration of the memory cell array of the semiconductor memory device according to the first embodiment.
Figure 4:
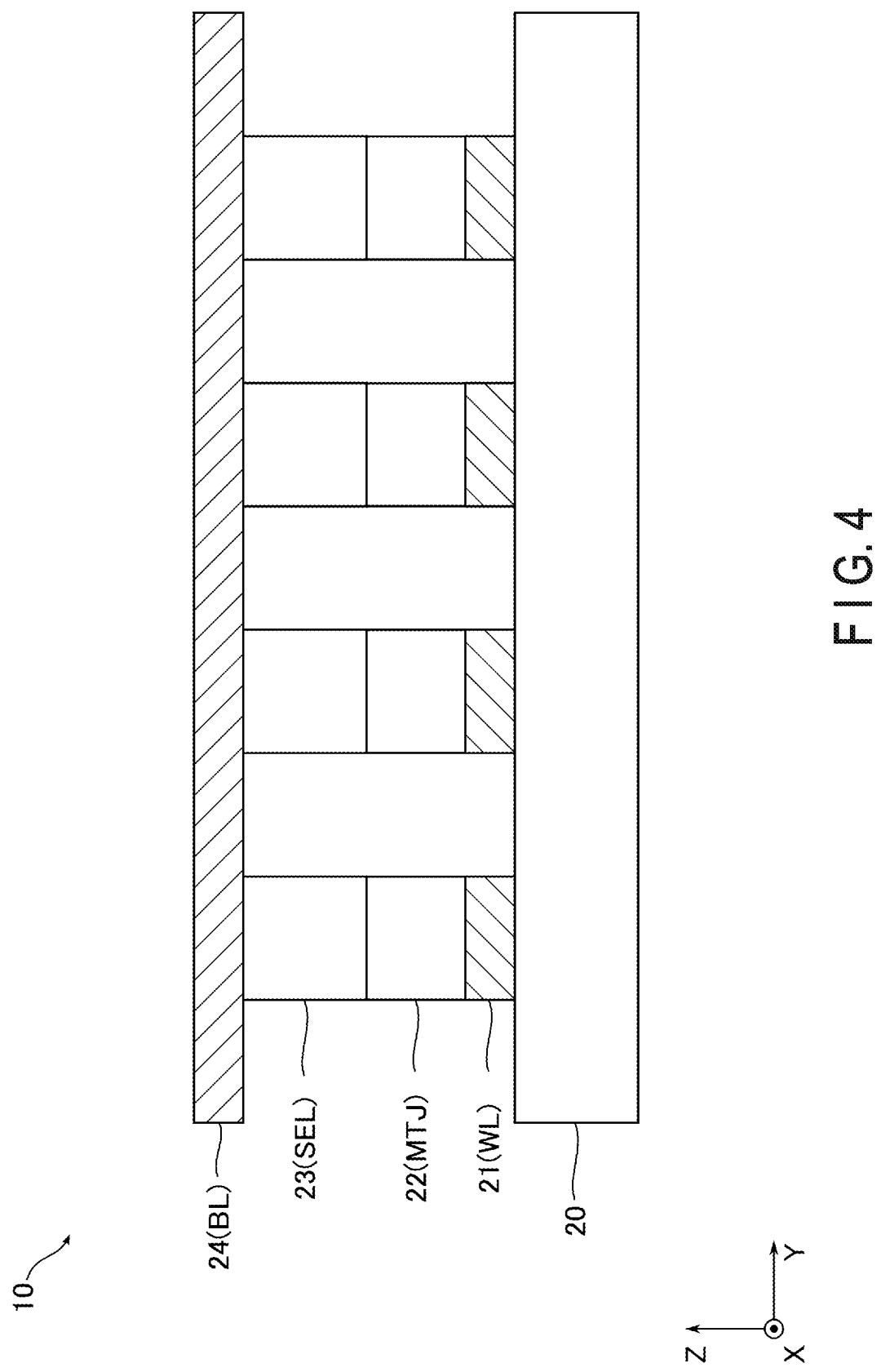
FIG. 4 is a sectional view to explain a configuration of the memory cell array of the semiconductor memory device according to the first embodiment.

Next, the cross-section structure of the memory cell array 10 will be described with reference to FIGS. 3 and 4. FIGS. 3 and 4 show examples of a cross-sectional view illustrating a configuration of the memory cell array of the semiconductor memory device according to the first embodiment. FIGS. 3 and 4 are cross-sectional views of the memory cell array 10 when viewed from different directions that are perpendicular to each other.

As shown in FIGS. 3 and 4, the memory cell array 10 is provided on a semiconductor substrate 20. In the following description, a plane in parallel to the surface of the semiconductor substrate 20 is defined as an XY plane, and an axis perpendicular to the XY plane is defined as a Z axis. An axis along the word lines WL is defined as an X axis, and an axis along the bit lines BL is defined as a Y axis. That is, FIG. 3 is a cross-sectional view of the memory cell array 10 when viewed along the Y axis, while FIG. 4 is a cross-sectional view of the memory cell array 10 when viewed along the X axis.

An upper surface of the semiconductor substrate 20 is disposed with, for example, a plurality of conductors 21. The conductors 21 have conductivity and function as word lines WL. The conductors 21 are, for example, arranged in the Y axis, with each extending in the X axis. FIGS. 3 and 4 illustrate a case where the plurality of conductors 21 are disposed on the semiconductor substrate 20; however, the configuration is not limited to this. For example, the plurality of conductors 21 may be disposed above the semiconductor substrate 20 out of contact therewith.

An upper surface of a single conductor 21 is disposed with a plurality of elements 22 each of which functions as a magnetoresistive effect element MTJ. The elements 22 disposed on the upper surface of a single conductor 21 are, for example, arranged in the X axis. In other words, the plurality of elements 22 arranged in line in the X axis are coupled in common to the upper surface of a single conductor 21. The configuration of the elements 22 will be described later in detail.

An upper surface of each of the elements 22 is disposed with an element 23 which functions as a switching element SEL. An upper surface of each of the elements 23 is coupled to any one of conductors 24. The conductors 24 have conductivity and function as bit lines BL. The conductors 24 are, for example, arranged in the X axis, with each extending in the Y axis. In other words, the plurality of elements 23 arranged in line in the Y axis are coupled in common to a lower surface of a single conductor 24.

FIGS. 3 and 4 illustrate a case where the conductors 21, the elements 22, the elements 23, and the conductors 24 are disposed in mutual contact; however, the configuration is not limited to this. For example, the conductors 21, the elements 22, the elements 23, and the conductors 24 may be coupled together via a conductive contact plug (not shown).

The memory cell array 10 configured as described above has a structure in which a memory cell MC is disposed between a bit line BL and a word line WL that are associated with each other. FIGS. 3 and 4 illustrate a case where a bit line BL is associated with a single word line WL; however, the configuration is not limited to this. For example, the memory cell array 10 may have a multi-layered structure by laminating an additional memory cell MC and an additional word line WL above a bit line BL. A vertically-structured relation between a word line WL and a bit line BL is not limited to the example illustrated in FIGS. 3 and 4, and may be set at will.

1.1.3 Configuration of Magnetoresistive Effect Element

Figure 5:
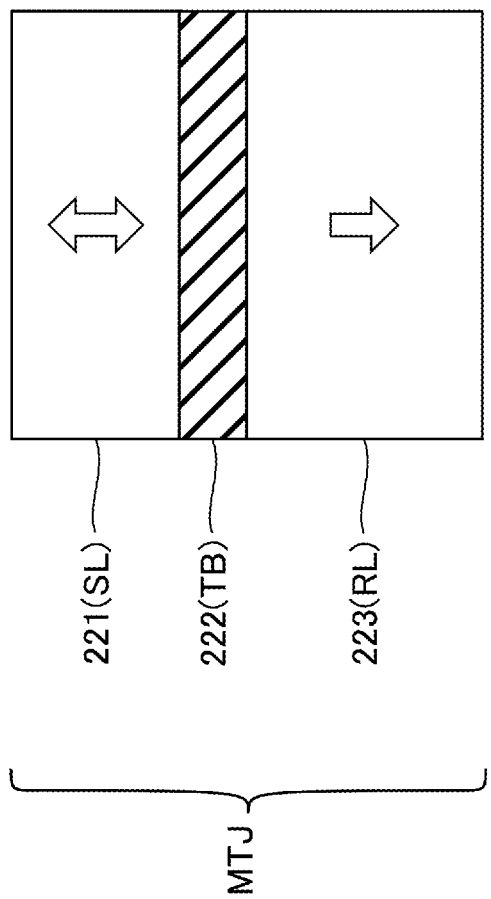
FIG. 5 is a sectional view to explain a configuration of a magnetoresistive effect element of the magnetic memory device according to the first embodiment.

Next, a configuration of the magnetoresistive effect element of the semiconductor memory device according to the first embodiment will be described with reference to FIG. 5. FIG. 5 is a cross-sectional view illustrating a configuration of the magnetoresistive effect element of the semiconductor memory device according to the first embodiment. FIG. 5 shows an example of a cross-sectional view of the elements 22 shown in FIGS. 3 and 4, taken along a plane perpendicular in the Z axis (e.g., the XZ plane).

As shown in FIG. 5, each of the elements 22 (magnetoresistive effect elements MTJ) includes a ferromagnet 221 functioning as a storage layer SL, nonmagnet 222 functioning as a tunnel barrier layer TB, and a ferromagnet 223 functioning as a reference layer RL.

In each of the magnetoresistive effect elements MTJ, a plurality of materials, for example, the ferromagnet 223, the nonmagnet 222, and the ferromagnet 221 are stacked in this order, from the word line WL side toward the bit line BL side (in the direction of the Z axis). The magnetoresistive effect element MTJ functions as, for example, a perpendicular-magnetization type MTJ element in which each of the magnetization directions of the magnetic materials that constitute magnetoresistive effect element MTJ is oriented in a perpendicular direction with respect to a film surface.

The ferromagnet 221 has ferromagnetic properties, and has an axis of easy magnetization in a direction perpendicular to a film surface. The ferromagnet 221 has a magnetization direction oriented toward the bit line BL side or the word line WL side. The ferromagnet 221 includes, for example, cobalt-iron-boron (CoFeB) or iron boride (FeB), and may have a crystalline structure of a body-centered cubic (bcc) type.

The nonmagnet 222 is a non-magnetic insulating film, and includes magnesium oxide (MgO), for example. The nonmagnet 222 is disposed between the ferromagnet 221 and the ferromagnet 223. With this configuration, the ferromagnet 221, the nonmagnet 222, and the ferromagnet 223 constitute a magnetic tunnel junction.

The ferromagnet 223 has ferromagnetic properties, and has an axis of easy magnetization in a direction perpendicular to a film surface. The ferromagnet 223 has a magnetization direction oriented toward the bit line BL side or the word line WL side. The ferromagnet 223 includes, for example, cobalt-iron-boron (CoFeB) or iron boron (FeB). The magnetization direction of the ferromagnet 223 is fixed. In the example of FIG. 5, the magnetization direction is oriented to a surface opposite to a surface on which the nonmagnet 222 is disposed. In this description, "a magnetization direction is fixed" means that the magnetization direction is not changed by an electric current (or a spin torque) of such a magnitude that the magnetization direction of the ferromagnet 221 can be reversed.

For example, the semiconductor memory device 1 supplies a write current directly to such a magnetoresistive effect element MTJ configured as described above, injects spin torque into the storage layer SL and the reference layer RL by this write current, and controls the magnetization direction of the storage layer SL and the magnetization direction of the reference layer RL. This writing method is also called a spin injection write method. The magnetoresistive effect element MTJ can take one of a low-resistance state and a high-resistance state, depending on whether the magnetization directions of the storage layer SL and the reference layer RL are parallel or antiparallel.

If write current Iw0 of a certain magnitude is supplied to the magnetoresistive effect element MTJ in the direction indicated by arrow A1 in FIG. 5, i.e., from the storage layer SL to the reference layer RL, the relationship between the magnetization directions of the storage layer SL and the reference layer RL becomes parallel. In this parallel state, the resistance value of the magnetoresistive effect element MTJ becomes minimum, and the magnetoresistive effect element MTJ is set to a low-resistance state. This low-resistance state is called a "P (parallel) state", and is defined as a state of data "0".

If write current Iw1 larger than write current Iw0 is applied to the magnetoresistive effect element MTJ in the direction indicated by arrow A2 in FIG. 5, i.e., from the reference layer RL to the storage layer SL, the relationship between the magnetization directions of the storage layer SL and the reference layer RL becomes antiparallel. In this antiparallel state, the resistance value of the magnetoresistive effect element MTJ becomes maximum, and the magnetoresistive effect element MTJ is set to a high-resistance state. This high-resistance state is called an "AP (antiparallel) state", and is defined as a state of data "1". The following description will be given pursuant to the definitions of data described above.

However, the way of defining data "1" and data "0" is not limited to the example described above. For example, the P state may be defined as data "1", and the AP state may be defined as data "0".

1.1.4 Configuration of Read Circuit

Next, a configuration of the read circuit of the semiconductor memory device according to the first embodiment will be described.

Figure 6:
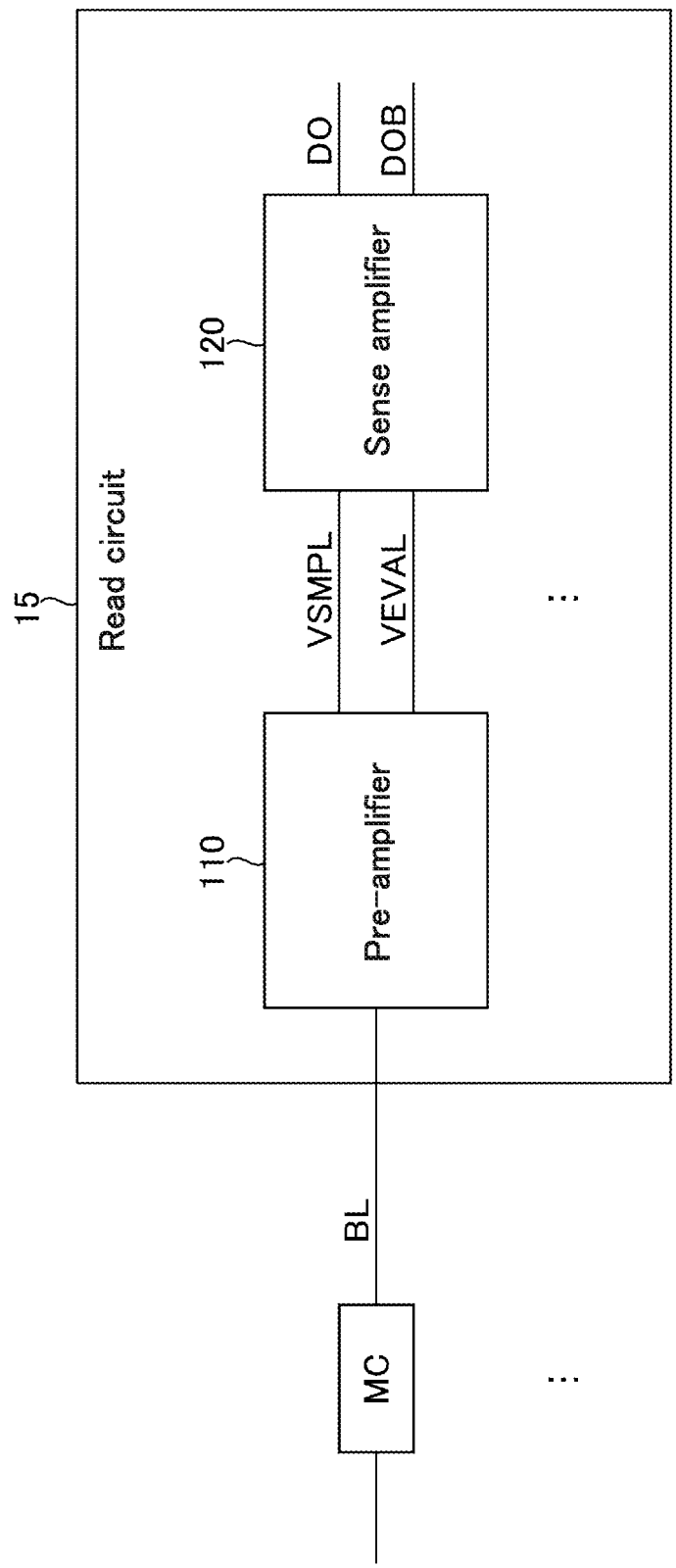
FIG. 6 is a block diagram to explain a configuration of a read circuit of the semiconductor memory device according to the first embodiment.

FIG. 6 is a block diagram illustrating a configuration of the read circuit of the semiconductor memory device according to the first embodiment. As shown in FIG. 6, the read circuit 15 includes a pre-amplifier 110 and a sense amplifier 120.

For example, the pre-amplifier 110 and the sense amplifier 120 are provided in a manner such that they are associated with a bit line BL. That is, a pair of the pre-amplifier 110 and the sense amplifier 120 are provided per bit line BL.

The pre-amplifier 110 is coupled to the memory cell MC via the associated bit line BL. The pre-amplifier 110 and the associated sense amplifier 120 are coupled together via nodes VSMPL and VEVAL. The sense amplifier 120 senses voltages supplied from the pre-amplifier 110 to the nodes VSMPL and VEVAL, and reads data from the memory cell MC. The read data is output as signals DO and DOB to an outside of the read circuit 15 via nodes N4 and N5.

Hereinafter, an example of circuit configurations of the pre-amplifier 110 and the sense amplifier 120 will be described.

1.1.4.1 Configuration of Pre-Amplifier

First, a configuration of the pre-amplifier 110 will be described.

FIG. 7 is a circuit diagram illustrating a configuration of the pre-amplifier of the semiconductor memory device according to the first embodiment. As shown in FIG. 7, the pre-amplifier 110 includes transistors T1, T2, T3, T4, T5, T6a, T6b, T7a, T7b, T8a, and T8b, and capacitors C1 and C2. The transistors T1, T2, T5, T6a, T7a, and T8a have, for example, an n-type polarity, whereas the transistors T3, T4, T6b, T7b, and T8b have, for example, a p-type polarity.

The transistor T1 includes a first end coupled to the bit line BL, a second end coupled to a first end of the transistor T2, and a gate to which a signal REN is supplied. The signal REN is, for example, a signal for instructing start and end of a read operation for reading data from the memory cell MC. The transistor T2 includes a second end coupled to a node N1 and a gate to which a signal VCLMP is supplied. The signal VCLMP is, for example, a signal for clamping a voltage to be applied to the memory cell MC via the transistor T2 to a predetermined voltage.

The transistor T3 includes a first end and a gate that are coupled to the node N1, and a second node to which voltage VDD is supplied. Voltage VDD is, for example, a power-supply voltage that is supplied from the voltage generation circuit 16 in order to drive the read circuit 15. The transistor T4 includes a first end to which voltage VDD is supplied, a second end coupled to a node N2, and a gate coupled to the node N1. The transistors T3 and T4 function as a current mirror circuit, and are configured to apply to the node N2, a current corresponding to a current that flows through the memory cell MC when a read operation is performed.

The transistor T5 includes a first end coupled to the node N2, a grounded second end, and a gate coupled to the node VSMPL.

The transistor T6a includes a first end coupled to the node N2, a second end coupled to the node VSMPL, and a gate to which a signal SMa is supplied. The transistor T6b includes a first end coupled to the node N2, a second end coupled to the node VSMPL, and a gate to which a signal SMb as an inversion signal of the signal SMa is supplied. With this configuration, the transistors T6a and T6b are controllable in a manner such that, for example, they are simultaneously turned on or simultaneously turned off.

The transistor T7a includes a first end and a second end that are coupled to the node VSMPL, and a gate to which a signal DSMa is supplied. The transistor T7b includes a first end and a second end that are coupled to the node VSMPL, and a gate to which a signal DSMb as an inversion signal of the signal DSMa is supplied. With this configuration, the transistors T7a and T7b are controllable in a manner such that, for example, they are simultaneously turned on or simultaneously turned off.

The transistors T7a and T7b are configured to be equal in capacitance to the transistors T6a and T6b. This configuration makes the transistors T7a and T7b equivalent in switching property to the transistors T6a and T6b. In this description, a "capacitance" of a transistor correlates with, for example, a channel width of the transistor. In the example of FIG. 7, a channel width of the transistors T7a and T7b is configured to be half of a channel width of the transistors T6a and T6b.

The capacitor C1 includes a first end coupled to the node VSMPL and a grounded second end.

The transistor T8a includes a first end coupled to the node N2, a second end coupled to the node VEVAL, and a gate to which a signal EVa is supplied. The transistor T8b includes a first end coupled to the node N2, a second end coupled to the node VEVAL, and a gate to which a signal EVb as an inversion signal of the signal EVa is supplied. With this configuration, the transistors T8a and T8b are controllable in a manner such that, for example, they are simultaneously turned on or simultaneously turned off.

The capacitor C2 includes a first end coupled to the node VEVAL and a grounded second end.

The configuration described above enables the pre-amplifier 110 to charge each of the nodes VSMPL and VEVAL based on a current flowing through the memory cell MC.

1.1.4.2 Configuration of Sense Amplifier

Next, a configuration of the sense amplifier 120 will be described.

Figure 8:
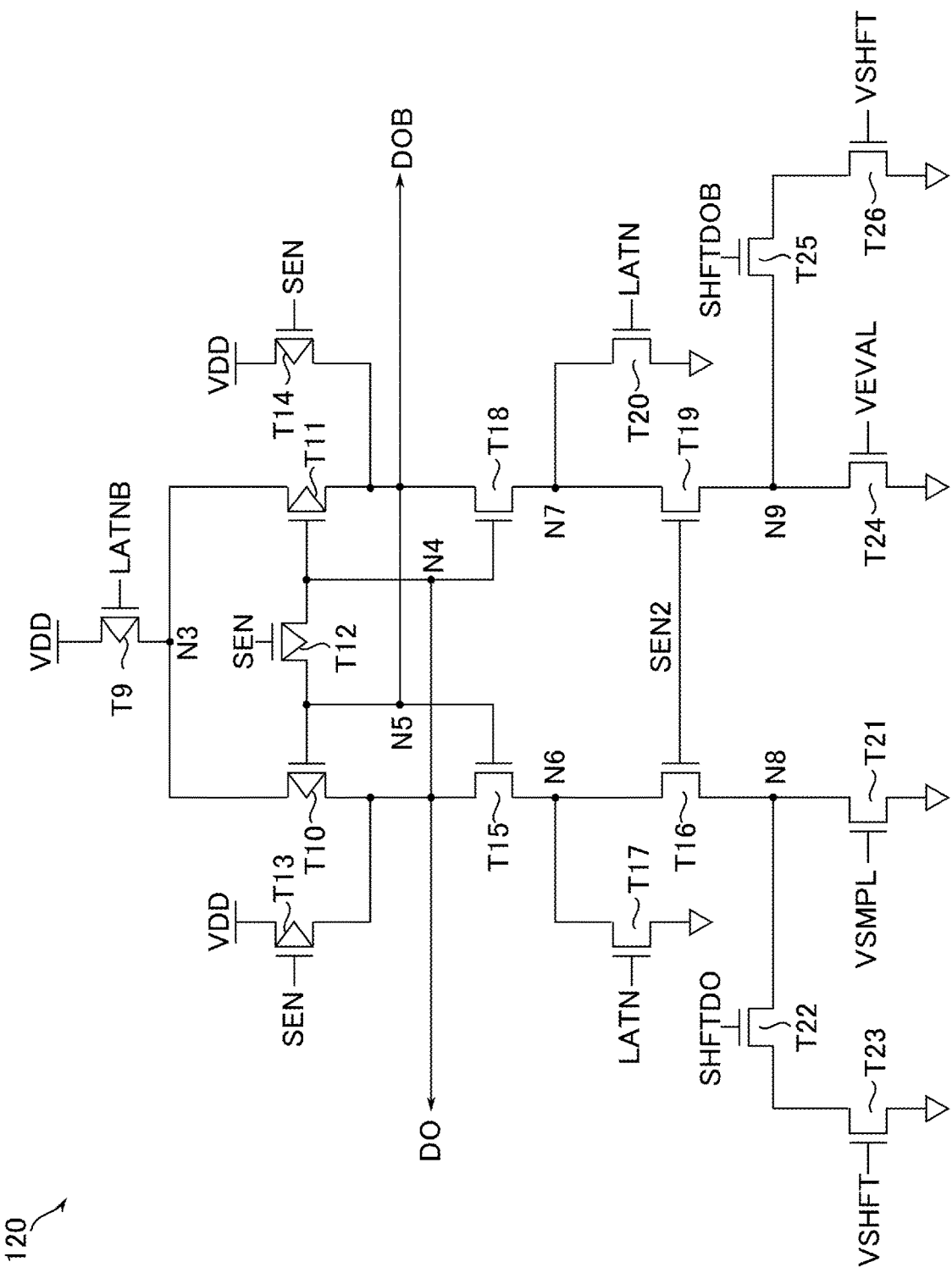
FIG. 8 is a circuit diagram to explain a configuration of a sense amplifier of the semiconductor memory device according to the first embodiment.

FIG. 8 is a circuit diagram illustrating a configuration of the sense amplifier of the semiconductor memory device according to the first embodiment. As shown in FIG. 8, the sense amplifier 120 includes transistors T9, T10, T11, T12, T13, T14, T15, T16, T17, T18, T19, T20, T21, T22, T23, T24, T25, and T26. The transistors T15 to T26 each have, for example, an n-type polarity, whereas the transistors T9 to T14 each have, for example, a p-type polarity.

The transistor T9 includes a first end to which voltage VDD is supplied, a second end coupled to a node N3, and a gate to which a signal LATNB is supplied. The signal LATNB is, for example, an inversion signal of a signal LATN to be described later.

The transistor T10 includes a first end coupled to the node N3, a second end coupled to a node N4, and a gate coupled to a node N5. The transistor T11 includes a first end coupled to the node N3, a second end coupled to the node N5, and a gate coupled to the node N4.

The transistor T12 includes a first end coupled to the node N4, a second end coupled to the node N5, and a gate to which a signal SEN is supplied. The signal SEN is, for example, one of signals for instructing start of sense processing for sensing a difference between voltages that are supplied to the nodes VSMPL and VEVAL.

The transistor T13 includes a first end to which voltage VDD is supplied, a second end coupled to the node N4, and a gate to which the signal SEN is supplied. The transistor T14 includes a first end to which voltage VDD is supplied, a second end coupled to the node N5, and a gate to which the signal SEN is supplied.

The transistor T15 includes a first end coupled to the node N4, a second end coupled to a node N6, and a gate coupled to the node N5. The transistor T16 includes a first end coupled to the node N6, a second end coupled to a node N8, and a gate to which a signal SEN2 is supplied. The signal SEN2 is, for example, like the signal SEN, one of signals for instructing start of sense processing. The transistor T17 includes a first end coupled to the node N6, a grounded second end, and a gate to which a signal LATN is supplied. The signal LATN is, for example, one of signals for instructing end of sense processing.

The transistor T18 includes a first end coupled to the node N5, a second end coupled to a node N7, and a gate coupled to the node N4. The transistor T19 includes a first end coupled to the node N7, a second end coupled to a node N9, and a gate to which the signal SEN2 is supplied. The transistor T20 includes a first end coupled to the node N7, a grounded second end, and a gate to which the signal LATN is supplied.

The transistor T21 includes a first end coupled to the node N8, a grounded second end, and a gate coupled to the node VSMPL. The transistor T22 includes a first end coupled to the node N8, a second end coupled to a first end of the transistor T23, and a gate to which a signal SHFTDO is supplied. The signal SHFTDO is, for example, a signal for instructing whether or not the sense amplifier 120 biases a voltage of the node VSMPL to be sensed. The transistor T23 includes a grounded second end and a gate to which a signal VSHFT is supplied. The signal VSHFT is, for example, a signal for instructing the bias amount of a voltage of the node VSMPL or VEVAL.

The transistor T24 includes a first end coupled to the node N9, a grounded second end, and a gate coupled to the node VEVAL. The transistor T25 includes a first end coupled to the node N9, a second end coupled to a first end of the transistor T26, and a gate to which a signal SHFTDOB as an inversion signal of the signal SHFTDO is supplied. The signal SHFTDOB is, for example, a signal for instructing whether or not the sense amplifier 120 biases a voltage of the node VEVAL to be sensed. The transistor T26 includes a grounded second end and a gate to which the signal VSHFT is supplied.

The configuration described above enables the sense amplifier 120 to compare a voltage supplied to the node VSMPL and a voltage supplied to the node VEVAL in terms of a magnitude relation, and to output this comparison result as signals DO and DOB from the nodes N4 and N5, respectively. Herein, the signal DOB is an inversion signal of the signal DO.

1.2 Operation

Next, an operation of the semiconductor memory device according to the first embodiment will be described.

Mainly, an operation for reading data from the memory cell MC will be described hereinafter.

1.2.1 Flowchart

Figure 9:
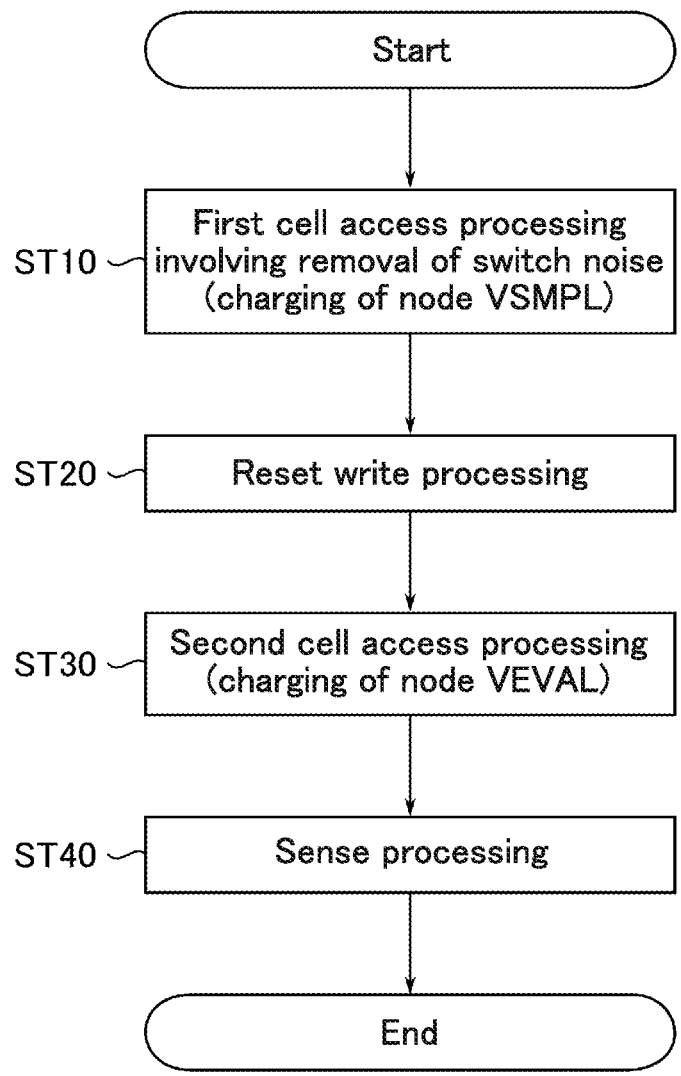
FIG. 9 is a block diagram to explain a read operation in the semiconductor memory device according to the first embodiment.

FIG. 9 is a flowchart illustrating a read operation in the semiconductor memory device according to the first embodiment. The flowchart illustrating in FIG. 9 includes various types of processing executed when data stored in a certain memory cell MC is read.

As shown in FIG. 9, in step ST10, the control circuit 18 executes first cell access processing by controlling the pre-amplifier 110. The first cell access processing includes processing for accessing a memory cell MC as a read target and charging a voltage based on data stored in this memory cell MC to the node VSMPL. When charging of the node VSMPL is finished, the control circuit 18 controls the pre-amplifier 110 in a manner such that noise caused in the node VSMPL is removed. Noise is caused in the node VSMPL mainly due to switching between ON and OFF of a transistor that controls charging of the node VSMPL. In the following description, this noise caused in the node. VSMPL is also called "switch noise".

Subsequently, in step ST20, the control circuit 18 controls the write circuit 14 to execute reset write processing. The reset write processing includes processing for writing predetermined data in a memory cell MC as a read target, thereby resetting data stored in this memory cell MC. For example, data "0" is applicable as data to be written in a memory cell MC by the reset write processing; however, data "1" may be written.

Subsequently, in step ST30, the control circuit 18 controls the pre-amplifier 110 to execute second cell access processing. The second cell access processing includes processing for accessing a memory cell MC as a read target and charging a voltage based on data stored in this memory cell MC to the node VEVAL. In other words, in the second cell access processing, the control circuit 18 charges a voltage based on the predetermined data written in the memory cell MC in step ST20, to the node VEVAL.

Thereafter, in step ST40, the control circuit 18 controls the sense amplifier 120 to execute sense processing. The sense processing is processing for comparing the voltage charged to the node VSMPL in step ST10 with the voltage charged to the node VEVAL in step ST30. With this configuration, the sense amplifier 120 judges whether or not data stored in a memory cell MC as a read target is different from predetermined data written in step ST20.

The operation described above enables the semiconductor memory device 1 to read data from a memory cell MC as a read target.

1.2.2 Timing Chart

Figure 10:
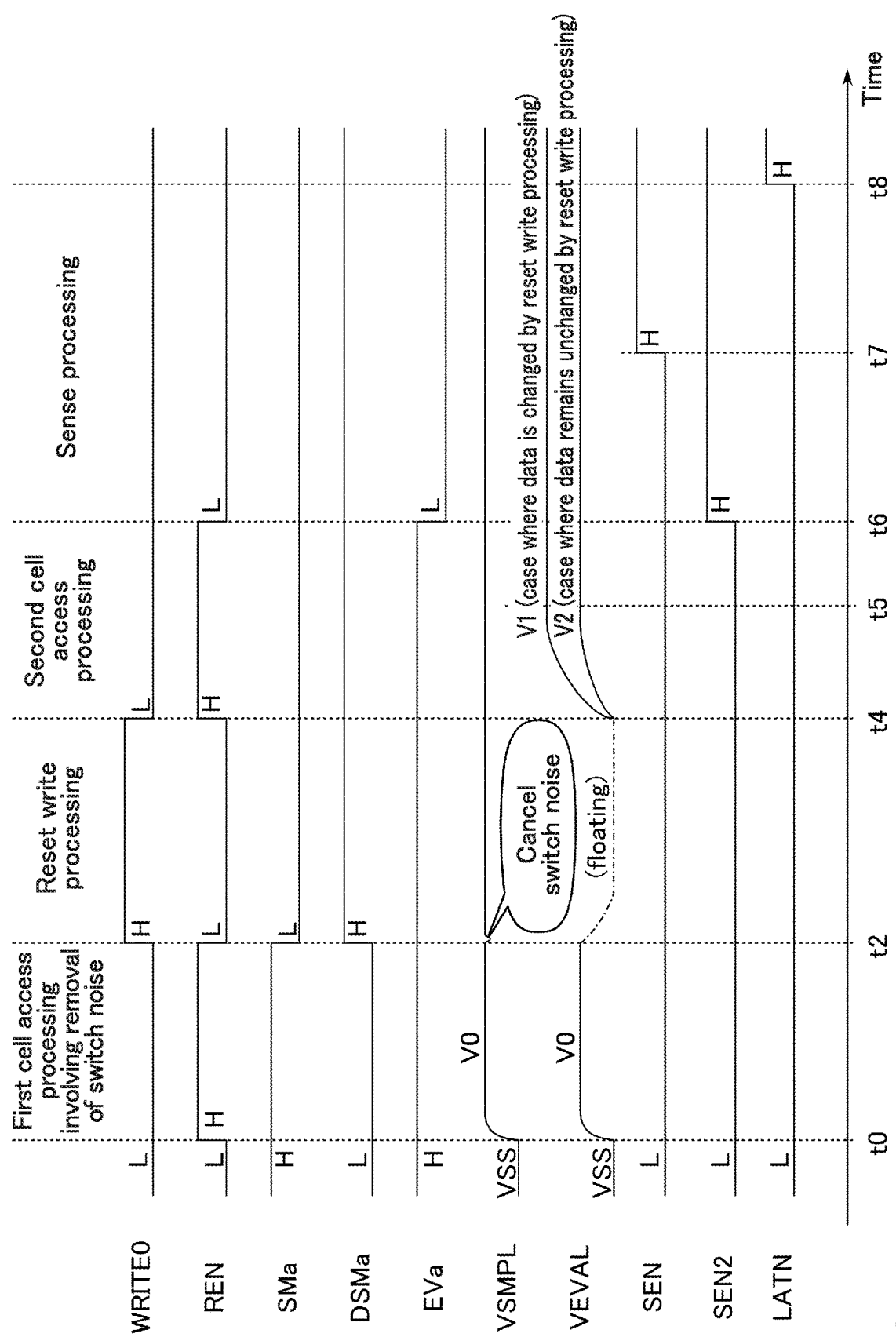
FIG. 10 is a timing chart to explain the read operation in the semiconductor memory device according to the first embodiment.

FIG. 10 is a timing chart illustrating the read operation in the semiconductor memory device according to the first embodiment. FIG. 10 shows a relation example between various signals supplied to the pre-amplifier 110 and the sense amplifier 120 and voltages charged to the nodes VSMPL and VEVAL in various types of processing shown in FIG. 9. In the example case shown in FIG. 10, data "0" is written as predetermined data in a memory cell MC as a read target in the reset write processing.

As shown in FIG. 10, the first cell access processing that involves removal of switch noise is executed from time t0 to time t2. Specifically, at time t0, the pre-amplifier 110 sets the transistor T1 to ON state by changing the signal REN from "L" level to "H" level. With this configuration, a predetermined voltage is applied to a memory cell MC as a read target and a current in accordance with stored data flows therethrough. Accordingly, a current corresponding to the current flowing through the memory cell MC flows through the node N2 via the current mirror circuit. At this time, the pre-amplifier 110 sets the transistors T6a and T6b to ON state by setting the signals SMa and SMb to "H" and "L" levels, respectively, while turning the transistors T7a and T7b to OFF state by setting the signals DSMa and DSMb to "L" and "H" levels, respectively. This increases a voltage of the node VSMPL from voltage VSS to voltage V0. Voltage VSS is a ground voltage and represents, for example, 0V. Voltage V0 is set to, for example a voltage which sets the transistor T5 to ON state.

Although the illustration is omitted in FIG. 10, voltage V0 to be charged to the node VSMPL slightly varies depending on data stored in a memory cell. MC as a read target. For example, on the condition that voltage V0 is to be charged to the node VSMPL when data "0" is stored in a memory cell MC as a read target, a voltage to be charged to the node VSMPL when data "1" is stored is smaller than voltage V0 by difference $\delta$ (>0).

After a voltage of the node VSMPL becomes stable, at time t2, the pre-amplifier 110 turns the transistors T6a and T6b to OFF state by setting the signals SMa and SMb to "L" and "H" levels, respectively, while setting the transistors T7a and T7b to ON state by setting the signals DSMa and DSMb to "H" and "L" levels, respectively. Accordingly, charging of the node VSMPL is stopped. The pre-amplifier 110 changes the signal REN from "H" level to "L" level, thereby setting the transistor T1 to OFF sate. In this manner, a read current to the memory cell MC is stopped, and the first cell access processing finishes.

Meanwhile, switch noise is caused in the node VSMPL when the transistors T6a and T6b are switched from ON state to OFF state. This switch noise is too large to disregard with respect to difference $\delta$ described above. On the other hand, as described above, the transistors T7a and T7b are equal in switching property to the transistors T6a and T6b. Thus, when the transistors T7a and T7b are switched from OFF state to ON state, switch noise is caused in the node VSMPL, and this noise is equal in magnitude and opposite in polarity to noise that is caused when the transistors T6a and T6b are switched from ON state to OFF state. Accordingly, switch noise that is caused when the transistors T6a and T6b are switched from ON state to OFF state can be canceled by the switch noise that is caused when the transistors T7a and T7b are switched from OFF state to ON state. This enables the pre-amplifier 110 to charge the node VSMPL to voltage V0 while suppressing the influence of switch noise.

Subsequently, the reset write processing is executed from time t2 to time t4. Specifically, at time t2, the write circuit 14 changes a signal WRITE0 from "L" level to "H" level, thereby overwriting data stored in a memory cell MC as a read target with predetermined data (for example, data "0"). In this manner, the data stored in the memory cell MC as a read target is temporarily lost.

In the reset write processing, the node VEVAL is in a floating state. Therefore, the node VEVAL may be decreased in voltage to around voltage VSS.

At time t4, the write circuit 14 changes the signal WRITE0 from "H" level to "L" level. In this manner, the reset write processing finishes.

Subsequently, the second cell access processing is executed from time t4 to time t6. Specifically, at time t4, the pre-amplifier 110 sets the transistor T1 to ON state again by changing the signal REN from "L" level to "H" level. With this configuration, a predetermined voltage is applied to a memory cell MC as a read target and a current in accordance with data "0" flows therethrough. At this time, the pre-amplifier 110 sets the transistors T8a and T8b to ON state by setting signals EVa and EVb to "H" and "L" levels, respectively. In this manner, the node VEVAL is charged via the node N2. A voltage of the node VEVAL is saturated at time t5.

When the second cell access processing is executed, the transistor T5 is in ON state with voltage V0 (or V0-$\delta$) charged to the node VSMPL. Accordingly, a current flowing through the node N2 is divided into a current flowing through the transistors T8a and T8b, and a current flowing through the transistor T5. As described above, a voltage of the node VSMPL varies from voltage V0 by a slight difference $\delta$ depending on data stored in a memory cell MC as a read target. This difference $\delta$ causes variations in current flowing through the transistor T5. Therefore, a current flowing from the node N2 to the transistors T8a and T8b varies depending on data stored in a memory cell MC as a read target. As a result, this varies a voltage of the node VEVAL after charging.

More specifically, in a case where data stored in a memory cell MC as a read target is the same as data overwritten by the reset write processing (in the example shown in FIG. 10, a case where data "0" is stored in a memory cell MC as a read target), the node VEVAL is charged to voltage V0. On the other hand, in a case where data stored in a memory cell MC as a read target is different from data overwritten by the reset write processing (in the example shown in FIG. 10, a case where data "1" is stored in a memory cell MC as a read target), the node VEVAL is charged to voltage V1 larger than voltage V0. A difference between voltage V1 and voltage V0 is significantly larger than difference $\delta$.

After a voltage of the node VEVAL becomes stable, at time t6, the pre-amplifier 110 sets the transistors T8a and T8b to OFF state by setting the signals EVa and EVb to "L" and "H" levels, respectively. Accordingly, charging of the node VEVAL is stopped. The pre-amplifier 110 sets the transistor T1 to OFF state by changing the signal REN from "H" level to "L" level. In this manner, a read current to the memory cell MC is stopped, and the second cell access processing finishes.

Subsequently, the sense processing is executed from time t6 to time t8. Specifically, at time t6, the pre-amplifier 120 sets the transistors T12 to T19 to ON state by setting the signals SEN2 and SEN to "H" and "L" levels, respectively, while setting the transistors T9 to T11, T17, and T20 to OFF state by setting the signals LATN and LATNB to "L" and "H" levels, respectively. Accordingly, the transistor T16 applies current ISMPL corresponding to a voltage of the node VSMPL to the node N8, while the transistor T19 applies current IEVAL corresponding to a voltage of the node VEVAL to the node N9.

At time t7, the sense amplifier 120 sets the transistors T12 to T14 to OFF state by setting the signal SEN to "H" level. This cuts off current supplied from the transistors T13 and T14. For this reason, a potential of the node N4 is determined based on current ISMPL flowing through the transistor T16, while a potential of the node N5 is determined based on current IEVAL flowing through the transistor T19. This causes a difference in potential between the node N4 and the node N5, and enables the sense amplifier 120 to output the signals DO and DOB that are inverted to each other.

The sense amplifier 120 is configured in a manner such that one of current ISMPL and current IEVAL can be shifted by the signals VSHFT, SHFTDO, and SHFTDOB. With the sense amplifier 120 thus configured, current ISMPL and current IEVAL can be made different from each other, and the Signals DO and DOB can be determined more surely.

After the signals DO and DOB are determined, at time t8, the sense amplifier 120 stops currents ISMPL and IEVAL by setting the signals LATN and LATNB to "H" level and "L" levels, respectively. Then, the sense processing finishes.

In this manner, the operation of reading data from a memory cell MC finishes.

1.3 Advantageous Effect of Present Embodiment

According to the first embodiment, misreading can be suppressed. This advantageous effect will be described below.

In the pre-amplifier 110, the node VSMPL is coupled in common to the gate of the transistor T5, the second end of each of the transistors T6a and T6b, the first end and the second end of each of the transistors T7a and T7b, and the first end of the capacitor C1. The transistors T6a, T6b, T7a, and T7b are adjusted in capacitance in a manner such that the pair of transistors T6a and T6b and the pair of transistors T7a and T7b are equal in switching property. Accordingly, in the first cell access processing, switch noise that is caused in the node VSMPL when the transistors T6a and T6b are switched from ON state to OFF state can be canceled by switching the transistors T7a and T7b from OFF state to ON state.

Figure 11:
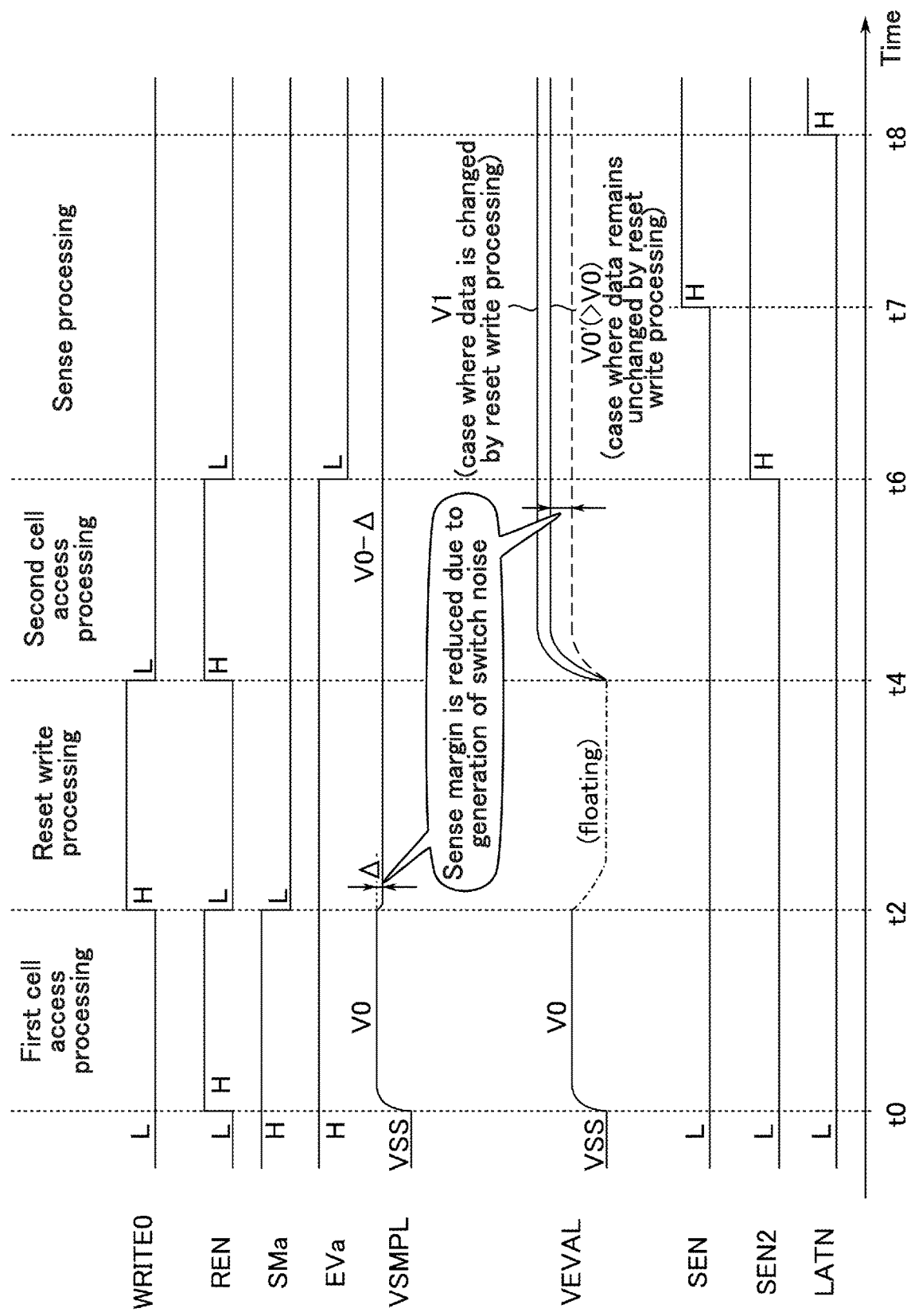
FIG. 11 is a timing chart to explain a read operation in a semiconductor memory device according to a comparative example.

FIG. 11 is a timing chart illustrating a read operation in a semiconductor memory device according to a comparative example. The read operation in the semiconductor memory device according to the comparative example does not execute switching of the transistors T7a and T7b from OFF state to ON state at time t2 described with reference to FIG. 10.

More specifically, as shown in FIG. 11, at time t2, a pre-amplifier according to the comparative example sets the transistors T6a and T6b to OFF state by setting the signals SMa and SMb to "L" and "H" levels, respectively. Accordingly, charging of the node VSMPL is stopped. At this time, a voltage of the node VSMPL is changed by switch noise, from voltage V0 to voltage (V0-Δ). FIG. 11 illustrates the example presented by Δ>0. Switch noise Δ is too large to disregard with respect to, for example, voltage difference δ caused in the node VSMPL along with variations in data stored in a memory cell. MC.

Subsequently, after the reset write processing is executed, the second cell access processing is executed from time t4 to time t6. As described above, the Semiconductor memory device is configured in a manner such that a voltage of the charged node VEVAL varies depending on voltage difference δ caused in the node VSMPL. However, according to the comparative example, a voltage of the node VEVAL varies in excess of the variation amount expected from difference δ, due to switch noise Δ. According to the example shown in FIG. 11, in a case where data "0" is written in a memory cell MC (the case where data remains unchanged by the reset write processing), a voltage of the node VEVAL becomes voltage V0' (>V0), whereas in a case where data "1" is written (the case where data is changed by the reset write processing), a voltage of the node VEVAL becomes voltage V1, substantially equal to the one in a case shown in FIG. 10. In those cases, a voltage difference in the node VEVAL, which is caused in accordance with data in a memory cell MC, is decreased (V1-V0>V1-V0'). When a voltage difference in the node VEVAL, which is caused in accordance with data in a memory cell MC, is decreased, a margin for correct judgment of data in the memory cell MC is reduced. This is unfavorable.

According to the first embodiment, the pre-amplifier 110 switches the transistors T7a and T7b to OFF state after switching the transistors T6a and T6b to OFF state. With this configuration, switch noise Δ caused due to switching of the transistors T6a and T6b can be canceled. This makes it possible to prevent a voltage of the node VEVAL from varying unintentionally due to switch noise Δ, and thus suppress misreading of data.

2. Second Embodiment

In the first embodiment, a case has been described where occurrence of switch noise Δ is prevented by setting the transistors T6a and T6b to OFF state and simultaneously setting the transistors T7a and T7b to ON state; however, the configuration is not limited to this. For example, switching of the transistors T7a and T7b may be performed at a different timing from a timing at which switching of the transistors T6a and T6b is performed. In the following, the descriptions of the configurations and operations similar to those in the first embodiment will be omitted, and mainly configurations and operations different from those in the first embodiment will be described.

2.1 Flowchart of Read Operation

Figure 12:
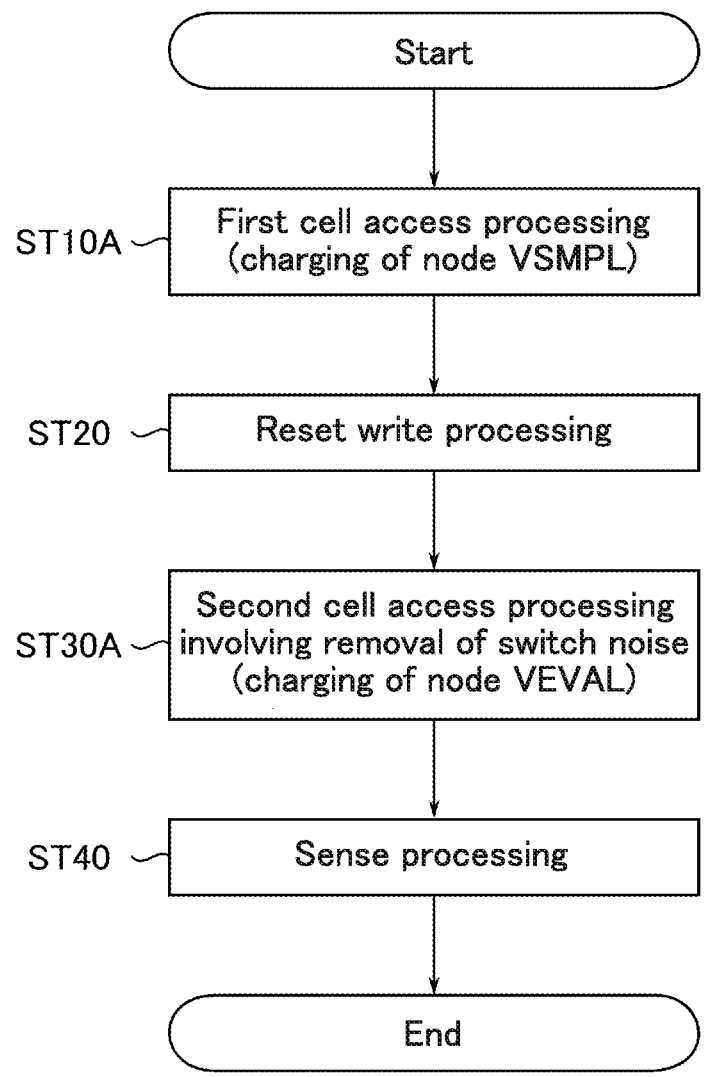
FIG. 12 is a flowchart to explain a read operation in a semiconductor memory device according to a second embodiment.

A read operation in a semiconductor memory device according to a second embodiment will be described with reference to a flowchart shown in FIG. 12. FIG. 12 corresponds to FIG. 9 in the first embodiment except that steps ST10A and ST30A are executed instead of steps ST10 and ST30 of FIG. 9.

As shown in FIG. 12, in step ST10A, the control circuit 18 controls the pre-amplifier 110 to execute the first cell access processing. In step ST10A, the pre-amplifier 110 does not remove switch noise Δ when executing the first cell access processing.

Subsequently, in step ST20, the control circuit 18 controls the write circuit 14 to execute reset write processing.

Subsequently, in step ST30A, the control circuit 18 controls the pre-amplifier 110 to execute second cell access processing. When executing the second cell access processing, the pre-amplifier 110 removes switch noise Δ.

Thereafter, in step ST40, the control circuit 18 controls the pre-amplifier 120 to execute sense processing.

By operating in a manner described above, the semiconductor memory device 1 reads data from a memory cell MC as a read target.

2.2 Timing Chart of Read Operation

Figure 13:
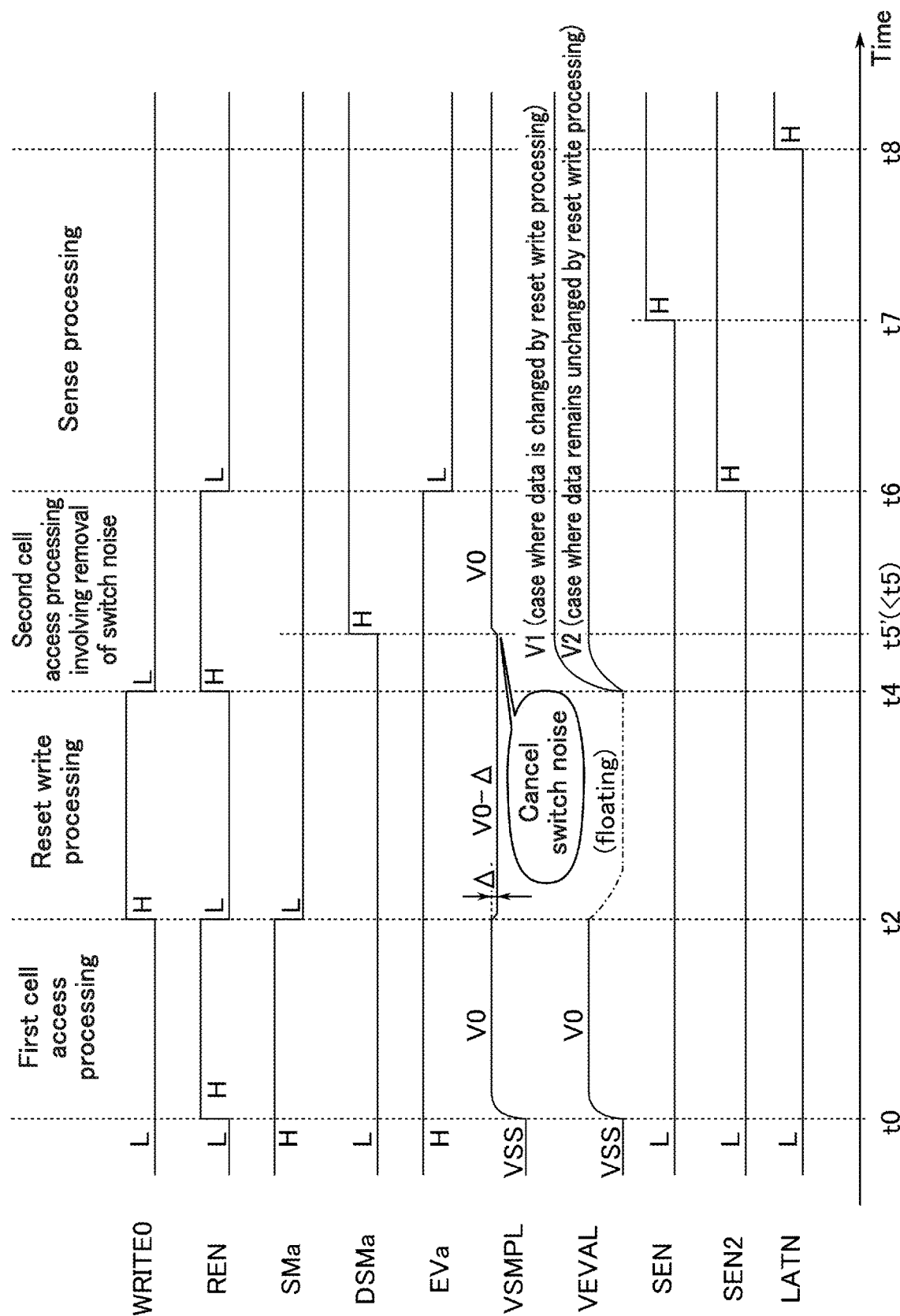
FIG. 13 is a timing chart to explain the read operation in the semiconductor memory device according to the second embodiment.

Next, the read operation in the semiconductor memory device according to the second embodiment will be described with reference to a timing chart shown in FIG. 13. FIG. 13 corresponds to FIG. 10 in the first embodiment.

As shown in FIG. 13, after a voltage of the node VSMPL increases up to V0 in the first cell access processing, at time t2, the pre-amplifier 110 sets the transistors T6a and T6b to OFF state by setting the signals SMa and SMb to "L" and "H" levels, respectively. Accordingly, charging of the node VSMPL is stopped. The pre-amplifier 110 then sets the transistor T1 to OFF state by changing the signal REN from "H" level to "L" level. In this manner, a read current to the memory cell MC is stopped, and the first cell access processing finishes.

At time t2, the transistors T7a and T7b remain in OFF state, thereby causing switch noise Δ in the voltage of node VSMPL. FIG. 13 illustrates a case where the node VSMPL has a voltage of V0-Δ (<V0).

Subsequently, after the reset write processing is executed, the second cell access processing is executed. Specifically, at time t4, the pre-amplifier 110 sets the transistor T1 to ON state again by changing the signal REN from "L" level to "H" level, while setting the transistors T8a and T8b to ON state by changing the signals EVa and EVb to "H" level and "L" level, respectively. In this manner, the node VEVAL is charged via the node N2.

At time t5', the pre-amplifier 110 sets the transistors T7a and T7b to ON state by setting the signals DSMa and DSMb to "H" level and "L" level, respectively. Accordingly, switch noise Δ in a voltage of the node VSMPL is removed, and a voltage of the node VSMPL becomes voltage V0.

Subsequent to time t5', a voltage of the node VEVAL is saturated at voltage V0 or V1. As described above, in the example shown in FIG. 13, voltage V0-Δ of the node VSMPL is smaller than voltage V0. This increases the amount of current that flows through the transistors T8a and T8b when the node VEVAL is charged, thereby increasing the speed of charging the node VEVAL. This results in time t5'<t5, and makes it possible to shorten a time required for a voltage of the node VEVAL to be saturated, as compared to a case where switch noise Δ is canceled when the first cell access processing finishes.

As the sense processing subsequent to time t6 is similar to that shown in FIG. 10, description thereof is omitted.

In this manner, the operation of reading data from a memory cell MC finishes.

2.3 Advantageous Effect of Present Embodiment

According to the second embodiment, after completion of the reset write processing, the transistors T7a and T7b are switched to ON state by time t5' (<t5) at which the node VEVAL is charged up to voltage V0 or V1. Accordingly, a time required for the second cell access processing can be shortened by utilizing the fact that the speed of charging the node VEVAL is increased in a case where a voltage of the node VSMPL becomes smaller than voltage V0 due to switch noise Δ applied to the node VSMPL.

After the node VEVAL is charged to a voltage of a desired value, the transistors T7a and T7b are switched to ON state. Accordingly, the node VEVAL can be charged without involving reduction of a sense margin such as shown in FIG. 11.

3. Third Embodiment

Next, a semiconductor memory device according to a third embodiment will be described. The third embodiment is similar to the first embodiment in that switch noise is removed before the second cell access processing. However, the third embodiment is different from the first embodiment in a configuration that a value of switch noise caused in the node VSMPL is gradually decreased, and the switch noise can be eventually canceled. In the following, the descriptions of the configurations and operations similar to those in the first embodiment will be omitted, and mainly configurations and operations different from those in the first embodiment will be described.

3.1 Configuration of Pre-Amplifier

Figure 14:
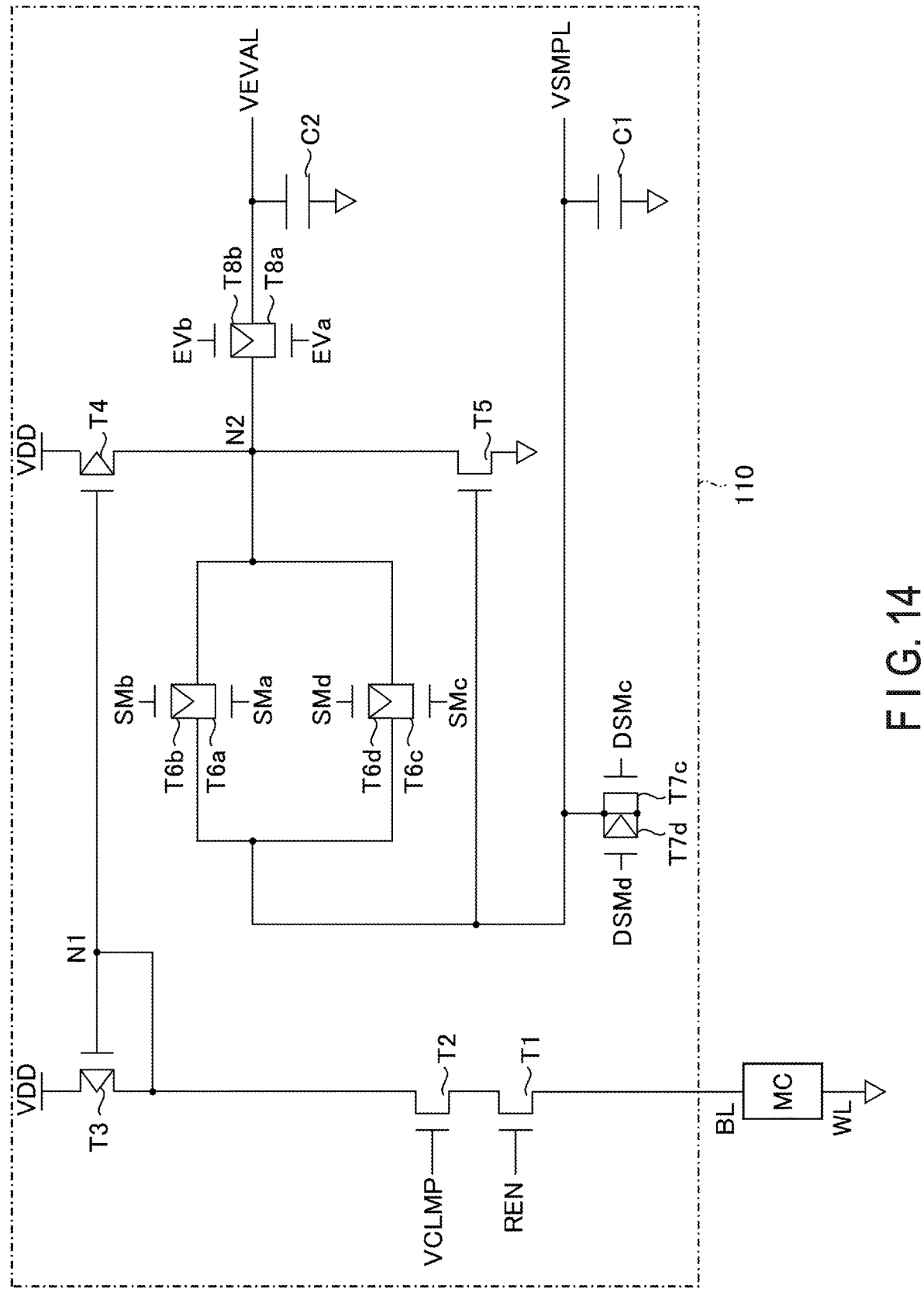
FIG. 14 is a circuit diagram to explain a configuration of a pre-amplifier of a semiconductor memory device according to a third embodiment.

FIG. 14 is a circuit diagram illustrating a configuration of a pre-amplifier of the semiconductor memory device according to the third embodiment. FIG. 14 corresponds to FIG. 7 in the first embodiment.

As shown in FIG. 14, the pre-amplifier 110 includes additional transistors T6c and T6d, and includes transistors T7c and T7d instead of the transistors T7a and T7b. The transistors T6c and T7c each have, for example, an n-type polarity, whereas the transistors T6d and T7d each have, for example, a p-type polarity.

The transistors T6c and T6d are coupled to the transistors T6a and T6b in parallel between the node N2 and the node VSMPL. That is, the transistor. T6c includes a first end coupled to the node N2, a second end coupled to the node VSMPL, and a gate to which a signal SMc is supplied. The transistor T6d includes a first end coupled to the node N2, a second end coupled to the node VSMPL, and a gate to which a signal SMd as an inversion signal of the signal SMc is supplied. With this configuration, the transistors T6c and T6d are controllable in a manner such that, for example, they are simultaneously set to ON state or simultaneously set to OFF state.

The transistors T6c and T6d are configured to have a smaller capacitance than that of the transistors T6a and T6b. Therefore, switch noise caused by switching of the transistors T6c and T6d is smaller than switch noise Δ caused by switching of the transistors T6a and T6b.

The transistor T7c includes a first end and a second end that are coupled to the node VSMPL, and a gate to which a signal DSMc is supplied. The transistor T7d includes a first end and a second end that are coupled to the node VSMPL, and a gate to which a signal DSMd as an inversion signal of the signal DSMc is supplied. With this configuration, the transistors T7c and T7d are controllable in a manner such that, for example, they are simultaneously set to ON state or simultaneously set to OFF state.

The transistors T7c and T7d are configured to be equal in capacitance to the transistors T6c and T6d. Specifically, a channel width of the transistors T7c and T7d is configured to be half of a channel width of the transistors T6c and T6d.

This configuration makes the transistors T7c and T7d equal in switching property to the transistors T6c and T6d.

3.2 Timing Chart of Read Operation

Figure 15:
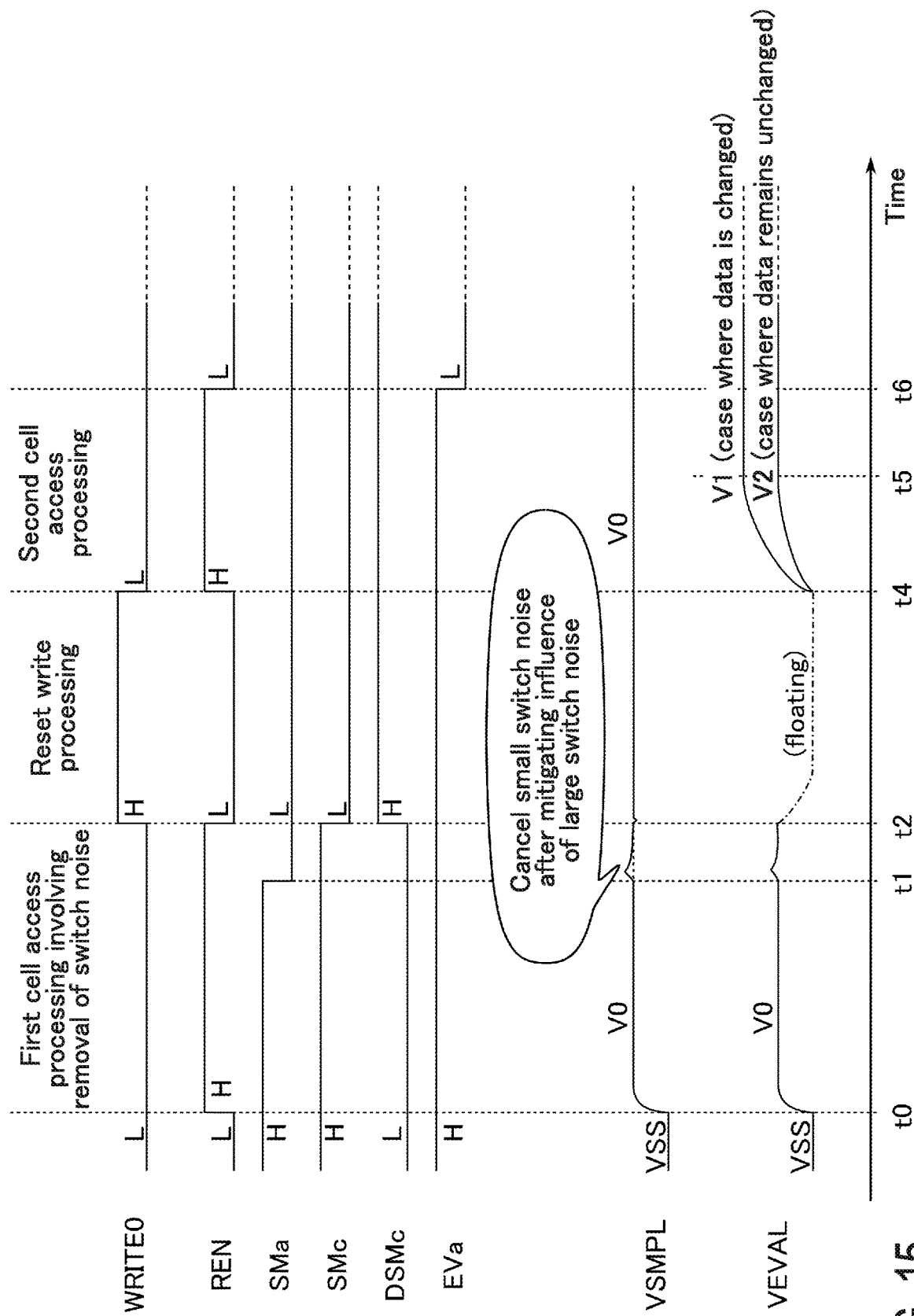
FIG. 15 is a timing chart to explain a read operation in the semiconductor memory device according to the third embodiment.

Next, the read operation in the semiconductor memory device according to the third embodiment will be described with reference to a timing chart shown in FIG. 15. FIG. 15 corresponds to FIG. 10 in the first embodiment.

As shown in FIG. 15, after a voltage of the node VSMPL increases up to V0 in the first cell access processing, at time t1, the pre-amplifier 110 sets the transistors T6a and T6b to OFF state by setting the signals SMa and SMb to "L" and "H" levels, respectively. With this configuration, relatively large switch noise Δ is caused in a voltage of the node VSMPL due to switching of the transistors T6a and T6b. However, the transistors T6c and T6d still remain in ON state, and weak charging of the node VSMPL continues.

Therefore, the influence of switch noise Δ is gradually mitigated, and a voltage of the node VSMPL gradually becomes to voltage V0.

After a voltage of the node VSMPL becomes stable, at time t2, the pre-amplifier 110 sets the transistors T6c and T6d to OFF state by setting the signals SMc and SMd to "L" and "H" levels, respectively, while setting the transistors T7c and T7d to ON state by setting the signals DSMc and DSMd to "H" and "L" levels, respectively. Accordingly, charging of the node VSMPL is stopped. The pre-amplifier 110 sets the transistor T1 to OFF state by changing the signal REN from "H" level to "L" level. In this manner, a read current to a memory cell MC is stopped, and the first cell access processing finishes.

Meanwhile, when the transistors T6c and T6d are switched from ON state to OFF state, relatively small switch noise Δ'(<V) is caused in a voltage of the node VSMPL due to switching of the transistors T6c and T6d. However, as described above, the transistors T7c and T7d are equal in switching property to the transistors T6c and T6d. Thus, when the transistors T7c and T7d are switched from OFF state to ON state, switch noise −Δ', which is equal in magnitude and opposite in polarity to switch noise Δ', is caused in a voltage of the node VSMPL. Therefore, switch noise Δ' caused by switching of the transistors T6c and T6d can be canceled by switch noise −Δ' caused by switching of the transistors T7a and T7b. This enables the pre-amplifier 110 to charge the node VSMPL to voltage V0 while suppressing the influence of switch noise.

As the reset write processing, the second cell access processing, and the sense processing subsequent to time t2 are similar to the ones shown in FIG. 10, descriptions thereof are omitted.

In this manner, the operation of reading data from a memory cell MC finishes.

3.3 Advantageous Effect of Present Embodiment

According to the third embodiment, the pre-amplifier 110 is configured to have two parallel current paths formed by the respective transistors having different capacitances (that is, the pair of transistors T6a and T6b, and the pair of transistors T6c and T6d) by which the node VSMPL can charge. The node VSMPL is coupled to the transistors T7c and T7d equal in capacitance to the aforementioned transistors T6c and T6d having a smaller capacitance than the transistors T6a and T6b. With this configuration, the magnitude of switch noise that may be caused in the node VSMPL can be gradually reduced and removed from the node VSMPL.

Note that switch noise does not always decrease a voltage of the node VSMPL, as described with reference to FIG. 11, etc. For example, switch noise which increases a voltage of the node VSMPL may be caused by a manufacturing process or temperature fluctuation of the pre-amplifier 110, fluctuation of voltage VDD, etc. In such a case, immediate removal of the influence of switch noise may be preferable to shortening a charging time of the node VEVAL by using the switch noise in addition, a variation may be caused in switching property of a transistor formed in order to cancel switch noise. Therefore, in the case of large switch noise, the influence of switch noise may not be completely removed from the node VSMPL.

According to the third embodiment, after charging of the node VSMPL, the pre-amplifier 110 maintains the transistors T6c and T6d in ON state while switching the transistors T6a and T6b having a larger capacitance to OFF state. With this configuration, the node VSMPL is temporarily influenced by switch noise Δ caused by switching of the transistors T6a and T6b; however, the influence of this switch noise Δ can be mitigated by charging the node VSMPL via the transistors T6c and T6d.

After a voltage of the node VSMPL becomes stable, the pre-amplifier 110 switches the transistors T6c and T6d to OFF state. With this configuration, switch noise Δ' to be applied to the node VSMPL becomes smaller than switch noise Δ. Therefore, even if the influence of switch noise Δ' cannot be completely removed by switching the transistors T7c and T7d to ON state, the influence of switch noise remaining in the node VSMPL can be reduced. Therefore, misreading of data can be suppressed.

4. Fourth Embodiment

Next, a semiconductor memory device according to a fourth embodiment will be described. The fourth embodiment is configured to use the read operation described in the second embodiment or the read operation described in the third operation, as the situation demands. In the following, the descriptions of the configurations and operations similar to those in the second embodiment and the third embodiment will be omitted, and mainly configurations and operations different from those in the second embodiment and the third embodiment will be described.

4.1 Configuration of Semiconductor Memory Device

Figure 16:
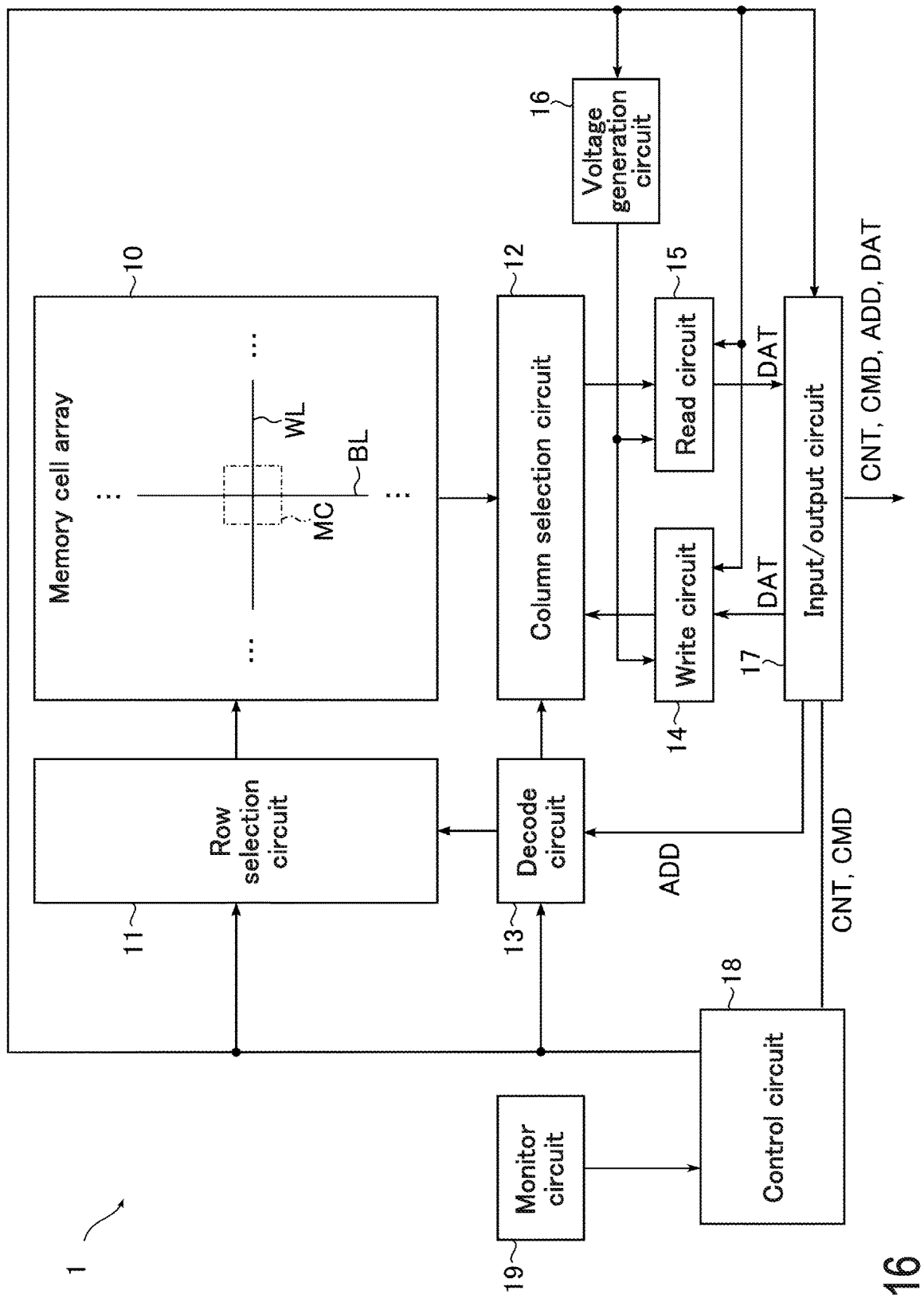
FIG. 16 is a block diagram to explain a configuration of a semiconductor memory device according to a fourth embodiment.

FIG. 16 is a block diagram illustrating a configuration of a semiconductor memory device according to the fourth embodiment. As shown in FIG. 16, the semiconductor memory device 1 further includes a monitor circuit 19.

The monitor circuit 19 monitors an operation status within the semiconductor memory device 1 and obtains monitor information for use in determining a timing for removing switch noise applied to the node VSMPL. The monitor circuit 19 sends the monitor information to the control circuit 18.

Monitor items of the monitor circuit 19 include, for example, PVT fluctuation factors within the pre-amplifier 110, that is, a manufacturing variation, a temperature, or a voltage. More specifically, for example, in a case where the monitor circuit 19 monitors a manufacturing variation, the monitor circuit 19 may monitor which one of a p-type transistor and an n-type transistor both formed within the pre-amplifier 110 has a larger coupling capacitance. For example, in a case where the monitor circuit 19 monitors a temperature, the monitor circuit 19 may monitor an operation temperature of the transistor within the pre-amplifier 110. In addition, in a case where the monitor circuit 19 monitors a voltage, for example, the monitor circuit 19 may monitor whether a voltage of the node N2 is equal to or larger than VDD/2, or is smaller than VDD/2.

The monitor circuit 19 is not limited to the above-described example, and may adopt any configuration that enables the monitor circuit 19 to monitor an item by which a suitable timing for removing switch noise applied to the node VSMPL can be determined and to obtain this monitor information.

Upon receipt of monitor information from the monitor circuit 19, the control circuit 18 judges based on this monitor information which timing for removing switch noise offers an advantage (in other words, whether it is effective or not that a timing at which switch noise is caused and a timing at which switch noise is removed are shifted from each other). As a result of the judgment, the control circuit 18 determines a timing for removing switch noise from the node VSMPL (for example, whether switch noise is removed before the second access processing or is removed during the second access processing), and applies this determined timing to the read operation.

4.2 Configuration of Pre-Amplifier

FIG. 17 is a circuit diagram illustrating a configuration of a pre-amplifier of the semiconductor memory device according to the fourth embodiment.

As shown in FIG. 17, the pre-amplifier 110 includes the transistors T6c, T6d, T7c, and T7d described with reference to FIG. 14 in the third embodiment, in addition to the transistors T6a, T6b, T7a, and T7b described with reference to FIG. 7 in the first embodiment.

That is, the pair of transistors T6a and T6b and the pair of transistors T7a and T7b are configured to be equal in capacitance and in switching property to each other. The pair of transistors T6c and T6d and the pair of transistors T7c and T7d are configured to be equal in capacitance and in switching property to each other.

4.3 Flowchart of Read Operation

Next, the read operation in the semiconductor memory device according to the fourth embodiment will be described with reference to a flowchart shown in FIG. 18.

Figure 18:
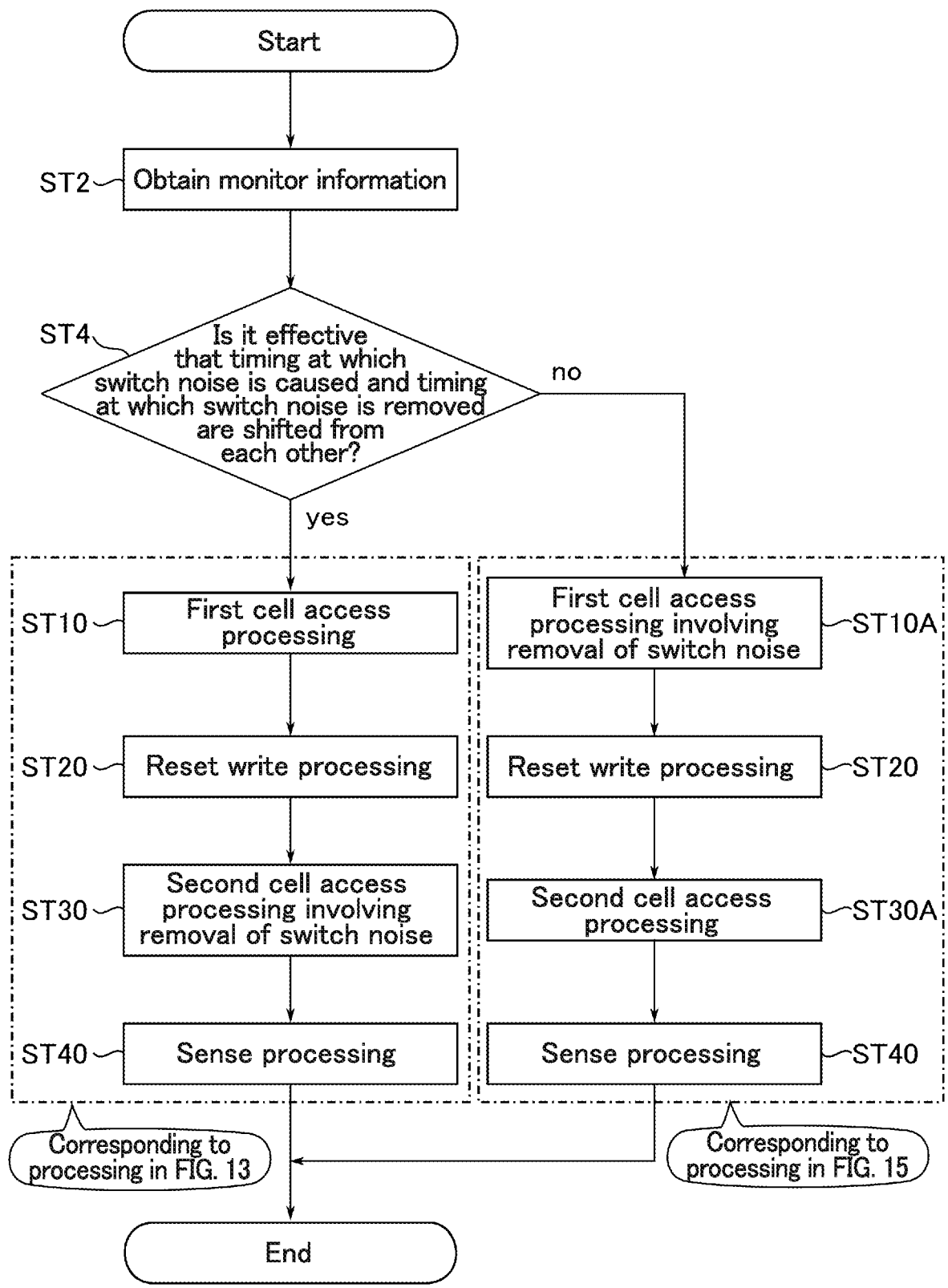
FIG. 18 is a flowchart to explain a read operation in the semiconductor memory device according to the fourth embodiment.

As shown in FIG. 18, in step ST2, the monitor circuit 19 monitors a PVT variation of the pre-amplifier 110, and obtains monitor information. The monitor circuit 19 sends the monitor information to the control circuit 18.

In step ST4, the control circuit 18 judges based on the monitor information, whether it is effective or not that a timing at which switch noise is caused and a timing at which switch noise is removed are shifted from each other. Whether it is effective or not that a timing at which switch noise is caused and a timing at which switch noise is removed are shifted from each other may be read as, for example, whether a time required for charging of the node VEVAL can be shortened or not by increasing the speed of charging the node VEVAL by switch noise being applied to the node VSMPL. More specifically, for example, the control circuit 18 makes this judgment based on monitor information regarding a voltage of the node N2 received from the monitor circuit 19. If a voltage of the node N2 is smaller than VDD/2, the control circuit 18 judges it is effective that a timing at which switch noise is caused and a timing at which switch noise is removed are shifted from each other. If a voltage of the node N2 is equal to or larger than VDD/2, the control circuit 18 judges it is not effective.

In the case of judgment that it is effective that a timing at which switch noise is caused and a timing at which switch noise is removed are shifted from each other (step ST4: Yes), the control circuit 18 executes the read operation while controlling the pre-amplifier 110 in a manner to remove switch noise during the second access processing. That is, the control circuit 18 executes the first cell access processing which does not involve removal of switch noise in step ST10. The control circuit 18 executes the reset write processing in step ST20. The control circuit 18 executes the second cell access processing which involves removal of switch noise in step ST30. The control circuit 18 executes the sense processing in step ST40.

This series of steps ST10, ST20, ST30, and ST40 corresponds to, for example, the processing described with reference to FIG. 13 in the second embodiment. With this configuration, a time required for a voltage of the node VEVAL to be saturated is shortened by switch noise of the node VSMPL, and the switch noise is eventually removed, so that the node VEVAL can be charged to a suitable value.

On the other hand, in the case of judgment that it is not effective that a timing at which switch noise is caused and a timing at which switch noise is removed are shifted from each other (step ST4: No), the control circuit 18 executes a read operation while controlling the pre-amplifier 110 in a manner to remove switch noise before the second access processing. Herein, "it is not effective that a timing at which switch noise is caused and a timing at which switch noise is removed are shifted from each other" may be read as "it is more effective to match a timing at which switch noise is caused with a timing at which switch noise is removed". In this case, the control circuit 18 executes the first cell access processing which involves removal of switch noise in step ST10A. The control circuit 18 executes the reset write processing in step ST20. The control circuit 18 executes the second cell access processing which does not involve removal of switch noise in step ST30A. The control circuit 18 executes the sense processing in step ST40.

This series of steps ST10A, ST20, ST30A, and ST40 corresponds to, for example, the processing described with reference to FIG. 15 in the third embodiment. Accordingly, switch noise can be removed from the node VSMPL prior to the second cell access processing.

4.4 Advantageous Effect of Present Embodiment

According to the fourth embodiment, the monitor circuit 19 obtains monitor information regarding a manufacturing variation, a temperature, and a voltage of the pre-amplifier 110. Accordingly, the control circuit 18 can obtain information used to predict how much influence switch noise to be applied to the node VSMPL has on the node VEVAL. This enables the control circuit 18 to suitably switch a timing for removing switch noise in the read operation, in accordance with an operation status of the pre-amplifier 110.

Specifically, the control circuit 18 judges a timing for removing switch noise, based on monitor information. In the case of judgment that it is effective to shift a timing at which switch noise is removed from a timing at which switch noise is caused, the control circuit 18 removes switch noise from the node VSMPL after charging of the node VEVAL is started. This makes it possible to increase the speed of charging the node VEVAL by utilizing switch noise applied to the node VSMPL, thereby producing a similar effect to that of the second embodiment.

In the case of judgment that it is not effective to shift a timing at which switch noise is removed from a timing at which switch noise is caused, the control circuit 18 removes switch noise from the node VSMPL before charging of the node VEVAL is started. To remove switch noise, after charging of the node VSMPL is completed, transistors that are different in capacitance and are arranged in parallel with each other in a charging path are switched to OFF state in the order of increasing capacitance. This makes it possible to suppress the magnitude of switch noise that is applied to the node VSMPL, thereby producing a similar effect to that of the third embodiment.

5. Others

The aforementioned first embodiment to fourth embodiments may have various modifications.

For example, each of the memory cells MC described in each of the above embodiments includes the magnetoresistive element MTJ and the switching element SEL having a two-terminal. However, the memory cells MC are not limited to this. For example, each of the memory cells MC may include the magnetoresistive effect element MTJ and a switching element SEL having a three-terminal (for example, a select transistor).

In each of the above embodiments, as an example, an MRAM which stores data using the magnetoresistive effect element is described as a resistance change element; however, this is not a limitation.

For example, the embodiments are applicable to a resistance change type memory similar to MRAM, for example, a semiconductor memory device which includes an element that stores data using a resistance change, such as ReRAM and PCRAM.

In addition, the embodiments are applicable to a semiconductor memory device including an element that can store data by a resistance change caused by application of a current or voltage, or can read data stored by converting a resistance difference caused by the resistance change into a current difference or a voltage difference, regardless of whether the memory device is a volatile memory or a nonvolatile memory.

While certain embodiments have been described, these embodiments have been presented by way of example only, and are not intended to limit the scope of the inventions. Indeed, the embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit.

What is claimed is:

1. A semiconductor memory device, comprising:
    a memory cell; and
    a control circuit configured to:
        charge a first node to a first voltage, the first voltage being based on an electric resistance of the memory cell when first data is stored in the memory cell;
        write second data to the memory cell after the first node is charged to the first voltage;
        charge a second node to a second voltage, the second voltage being based on an electric resistance of the memory cell when the second data is stored in the memory cell; and
        determine, based on the first voltage and the second voltage, whether or not the first data is different from the second data,
    wherein the control circuit includes:
        a first switching element including a first end electrically coupled to the first node, and a second end electrically coupled to a third node between the first node and the second node;
        a second switching element including a first end and a second end that are electrically coupled to the first node; and
        a third switching element including a first end electrically coupled to the second node and a second end electrically coupled to the third node,
    wherein the control circuit is configured to switch the second switching element to an ON state on or after switching the first switching element to an OFF state.

2. The device of claim 1, wherein the second switching element is equal in capacitance to the first switching element.

3. The device of claim 1, wherein the control circuit is configured to switch the second switching element to the ON state before starting to charge the second node based on the second data.

4. The device of claim 1, wherein the control circuit is configured to switch the second switching element to the ON state after starting to charge the second node based on the second data.

5. The device of claim 1, wherein:
    the control circuit further includes a fourth switching element electrically coupled in parallel to the first switching element between the first node and the third node; and
    the first switching element and the second switching element are smaller in capacitance than the fourth switching element.

6. The device of claim 5, wherein the second switching element is equal in capacitance to the first switching element.

7. The device of claim 5, wherein the control circuit is configured to switch the first switching element to the OFF state after switching the fourth switching element to an OFF state.

8. The device of claim 1, wherein:
    the control circuit further includes:
        a fourth switching element electrically coupled in parallel to the first switching element between the first node and the third node; and
        a fifth switching element including a first end and a second end that are electrically coupled to the first node; and
    the first switching element and the second switching element are smaller in capacitance than the fourth switching element and the fifth switching element.

9. The device of claim 8, wherein:
    the second switching element is equal in capacitance to the first switching element; and
    the fifth switching element is equal in capacitance to the fourth switching element.

10. The device of claim 8, further comprising a monitor circuit configured to monitor the semiconductor memory device,
    wherein the control circuit is configured to:
        when a monitor result of the monitor circuit meets a condition, switch the first switching element to the OFF state after switching the fourth switching element to an OFF state, and switch the second switching element to the ON state on or after switching the first switching element to the OFF state and before starting to charge the second node based on the second data; and
        when the monitor result of the monitor circuit does not meet the condition, switch the fourth switching element to the OFF state before switching the first switching element to the OFF state, and switch the second switching element to the ON state on or after switching the first switching element to the OFF state and after starting to charge the second node based on the second data.

11. The device of claim 10, wherein:
    the monitor result includes a voltage of the third node; and
    meeting the condition includes the voltage of the third node being equal to or larger than a predetermined value.

12. The device of claim 10, wherein:
    the monitor result includes a temperature; and
    meeting the condition includes the temperature exceeding a threshold value.

13. The device of claim 10, wherein:
    the control circuit further includes a first transistor and a second transistor that are different in polarity;

the monitor result includes a first capacitance of the first transistor and a second capacitance of the second transistor; and meeting the condition includes the first capacitance being larger than the second capacitance.

14. The device of claim 13, wherein:

the first switching element includes the first transistor and the second transistor; and the first transistor and the second transistor are electrically coupled together in parallel between the first node and the third node.

15. The device of claim 1, wherein the control circuit further includes a sixth switching element including a first end electrically coupled to the third node, a grounded second end, and a gate electrically coupled to the first node.

16. The device of claim 1, wherein the memory cell includes a resistance change element.

17. The device of claim 16, wherein the resistance change element is a magnetoresistive effect element.

* * * * *